United States Patent
Alrod et al.

(10) Patent No.: US 11,495,296 B2
(45) Date of Patent: **\*Nov. 8, 2022**

(54) READ THRESHOLD CALIBRATION FOR NONVOLATILE MEMORY WITH ENCODED FOGGY-FINE PROGRAMMING

(71) Applicant: Western Digital Technologies, Inc., San Jose, CA (US)

(72) Inventors: Idan Alrod, Herzliya (IL); Eran Sharon, Rishon Lezion (IL); Sergey Anatolievich Gorobets, Edinburgh (GB); Jack Frayer, Boulder Creek, CA (US); Tien-Chien Kuo, Sunnyvale, CA (US); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 46 days.

This patent is subject to a terminal disclaimer.

(21) Appl. No.: 17/171,612

(22) Filed: Feb. 9, 2021

(65) Prior Publication Data

US 2022/0230685 A1 Jul. 21, 2022

Related U.S. Application Data

(60) Provisional application No. 63/139,399, filed on Jan. 20, 2021.

(51) Int. Cl.
*G11C 16/10* (2006.01)
*G11C 11/56* (2006.01)
(Continued)

(52) U.S. Cl.
CPC .......... *G11C 16/10* (2013.01); *G06F 11/1068* (2013.01); *G11C 11/5671* (2013.01);
(Continued)

(58) Field of Classification Search
CPC . G11C 16/26; G11C 16/0483; G11C 11/5671; G11C 16/10; G06F 11/1068; H01L 27/11582

See application file for complete search history.

(56) References Cited

U.S. PATENT DOCUMENTS

| 7,643,342 B2 | 1/2010 | Litsyn et al. |
| 7,818,653 B2 | 10/2010 | Brandman et al. |

(Continued)

OTHER PUBLICATIONS

U.S. Appl. No. 16/899,374, filed Jun. 11, 2020.
(Continued)

*Primary Examiner* — Guy J Lamarre
(74) *Attorney, Agent, or Firm* — Vierra Magen Marcus LLP

(57) ABSTRACT

A storage apparatus includes non-volatile memory cells formed on a memory die, each memory cell configured to hold bits of data, and a control circuit. The control circuit is configured to calculate parity data for data to be stored in the memory cells and program the memory cells to first distributions. The control circuit is also configured to read memory cells in the first distributions, recover the data from results of reading the memory cells in the first distributions combined with the parity data, and further program the memory cells from the first distributions to second distributions to store the data. To improve the accuracy of recovering the encoded foggy phase data, techniques are presented to calibrate the voltage levels used in sensing the foggy state distributions.

20 Claims, 34 Drawing Sheets

(51) Int. Cl.
  *G11C 16/26* (2006.01)
  *G06F 11/10* (2006.01)
  *G11C 16/04* (2006.01)
  *H01L 27/11582* (2017.01)

(52) U.S. Cl.
  CPC .......... *G11C 16/0483* (2013.01); *G11C 16/26* (2013.01); *H01L 27/11582* (2013.01)

(56) References Cited

U.S. PATENT DOCUMENTS

| | | | |
|---|---|---|---|
| 8,885,410 | B2 | 11/2014 | Marcu et al. |
| 9,400,713 | B2 | 7/2016 | Gorobets |
| 9,442,839 | B1 | 9/2016 | Sharma et al. |
| 9,640,253 | B2 | 5/2017 | Conley et al. |
| 9,697,905 | B2 | 7/2017 | Sharon et al. |
| 10,748,599 | B1 | 8/2020 | Hsiao |
| 10,963,339 | B2 * | 3/2021 | Ji ........................... H03K 19/21 |
| 11,164,634 | B2 * | 11/2021 | Yang ................... G11C 11/5628 |
| 2015/0242143 | A1 * | 8/2015 | Kim ..................... G11C 16/349 714/704 |
| 2016/0093372 | A1 | 3/2016 | Fainzilber et al. |
| 2019/0130982 | A1 * | 5/2019 | Reusswig ............. G11C 29/52 |
| 2020/0168289 | A1 | 5/2020 | Lin et al. |
| 2020/0186171 | A1 | 6/2020 | Lin et al. |
| 2020/0192807 | A1 | 6/2020 | Rub et al. |
| 2020/0194064 | A1 | 6/2020 | Barndt et al. |
| 2020/0194078 | A1 | 6/2020 | Kondo |
| 2020/0286562 | A1 | 9/2020 | Gorobets et al. |
| 2021/0191636 | A1 | 6/2021 | Ji et al. |
| 2021/0211142 | A1 | 7/2021 | Hyodo et al. |
| 2022/0020440 | A1 | 1/2022 | Kimura |
| 2022/0084613 | A1 | 3/2022 | Fitzpatrick et al. |

OTHER PUBLICATIONS

U.S. Appl. No. 17/171,599, filed Feb. 9, 2021.
First Action Interview Pilot Program Pre-interview Communication dated Jul. 8, 2022, U.S. Appl. No. 17/171,599, filed Feb. 9, 2021.

* cited by examiner

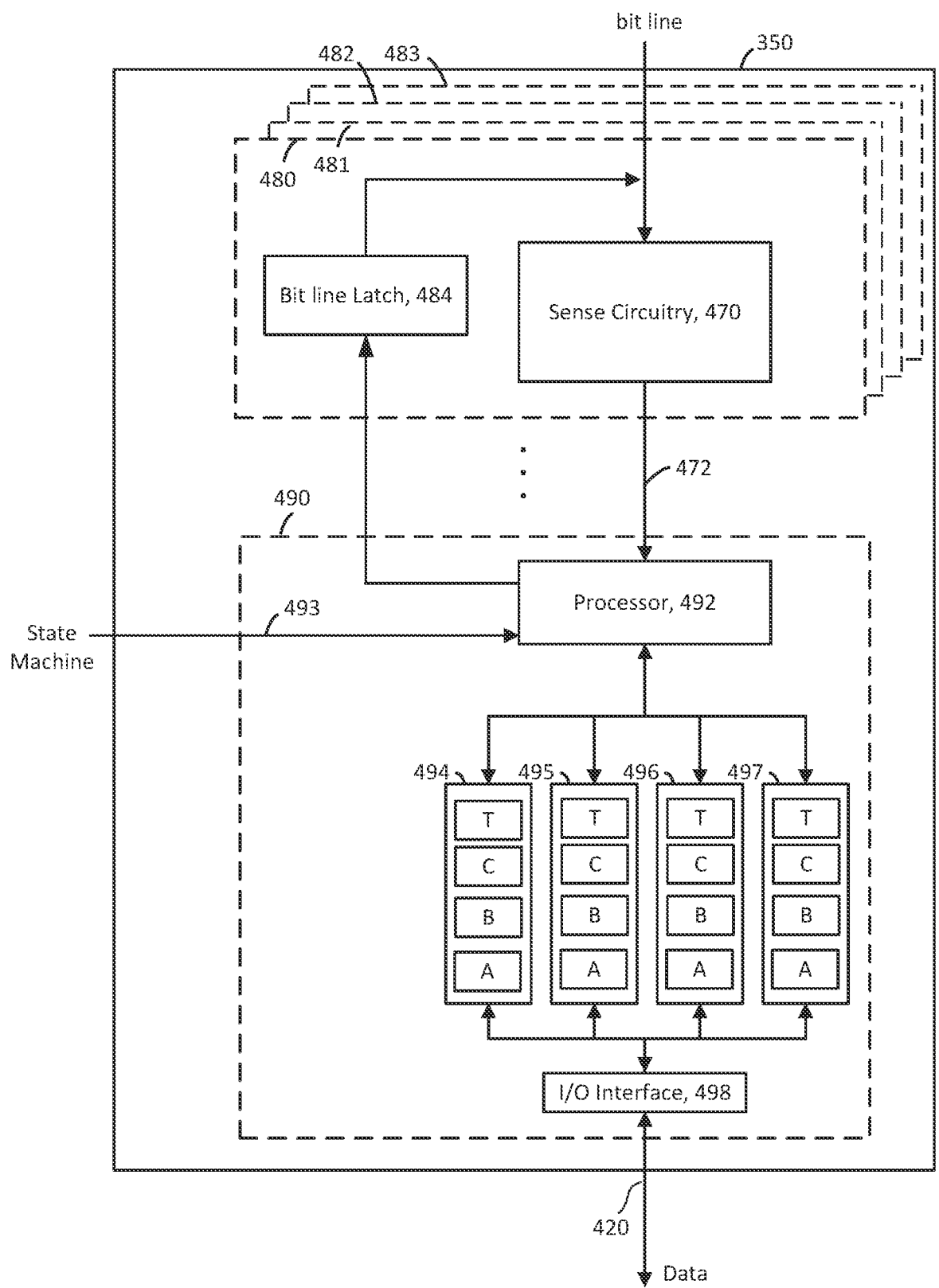

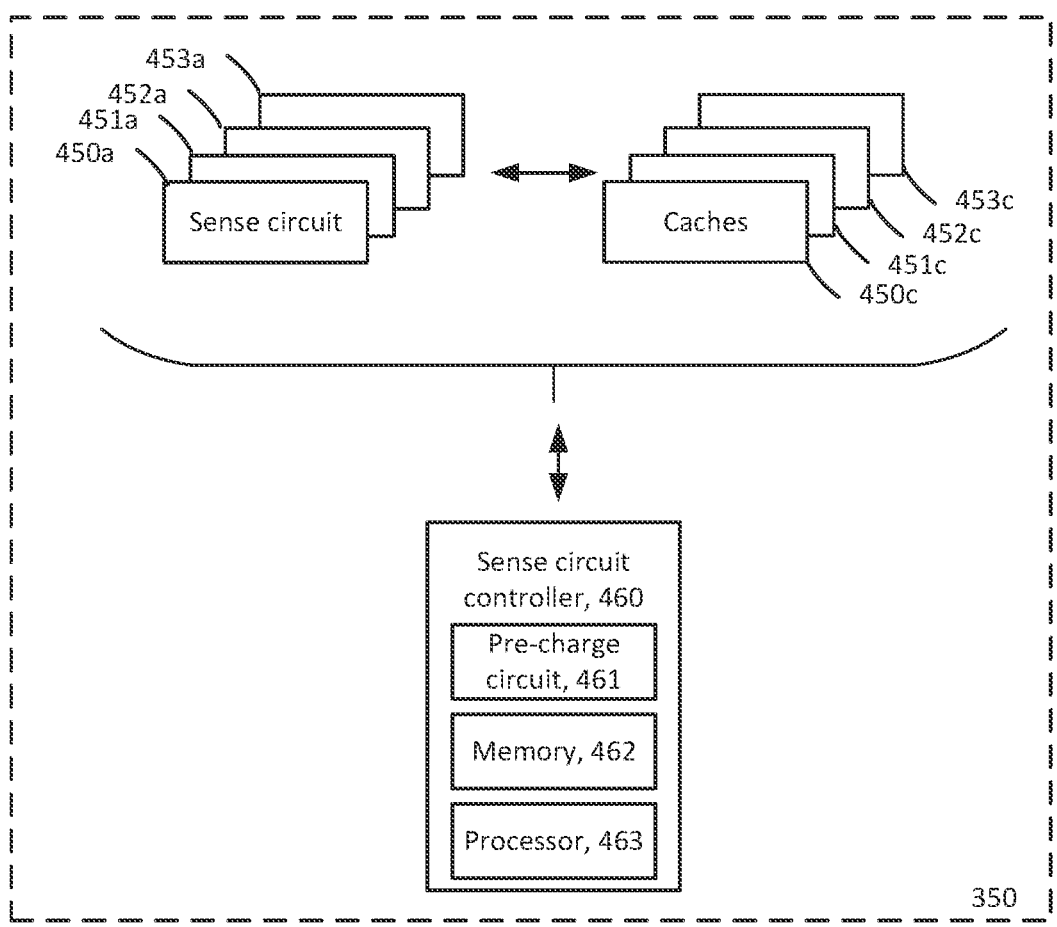

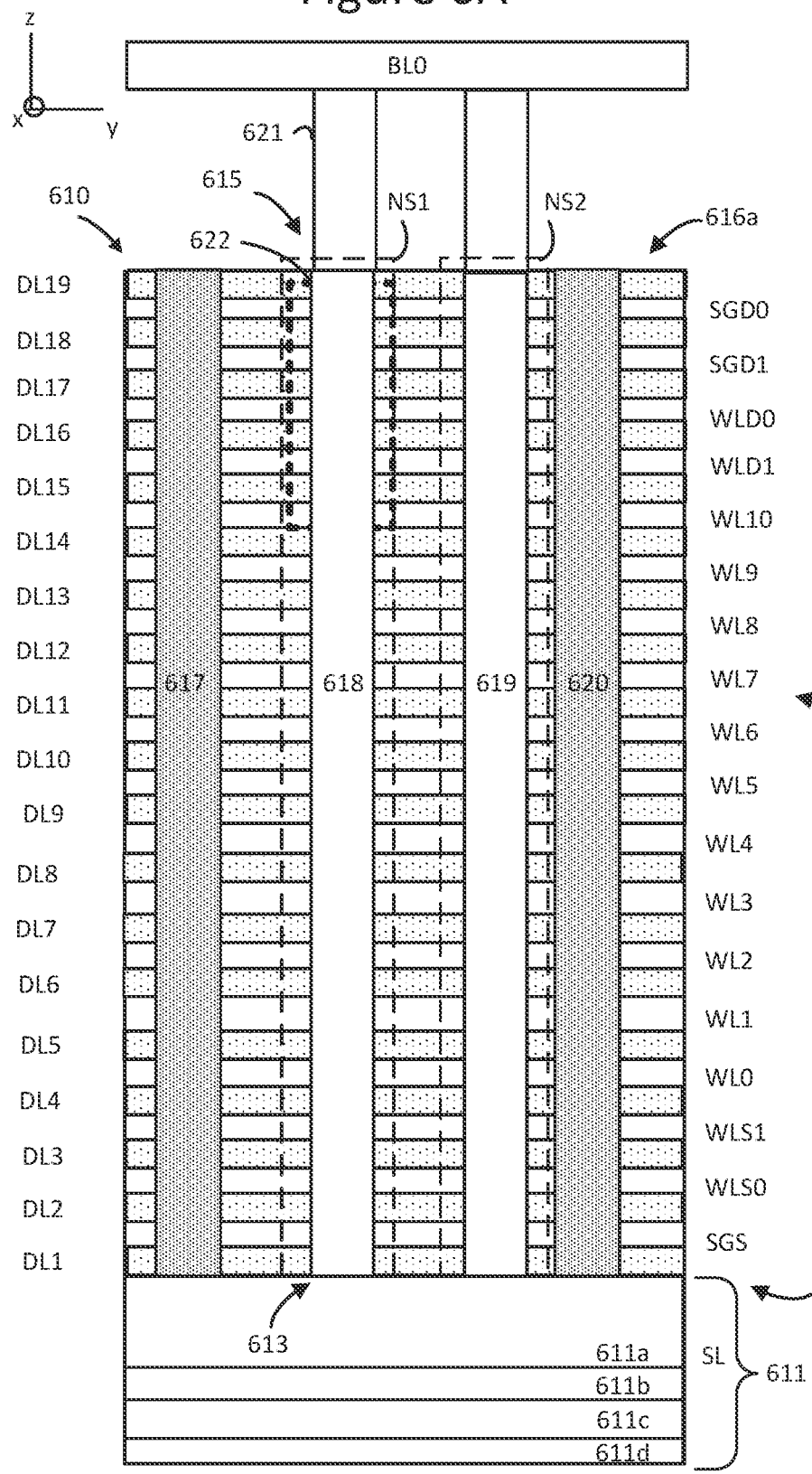

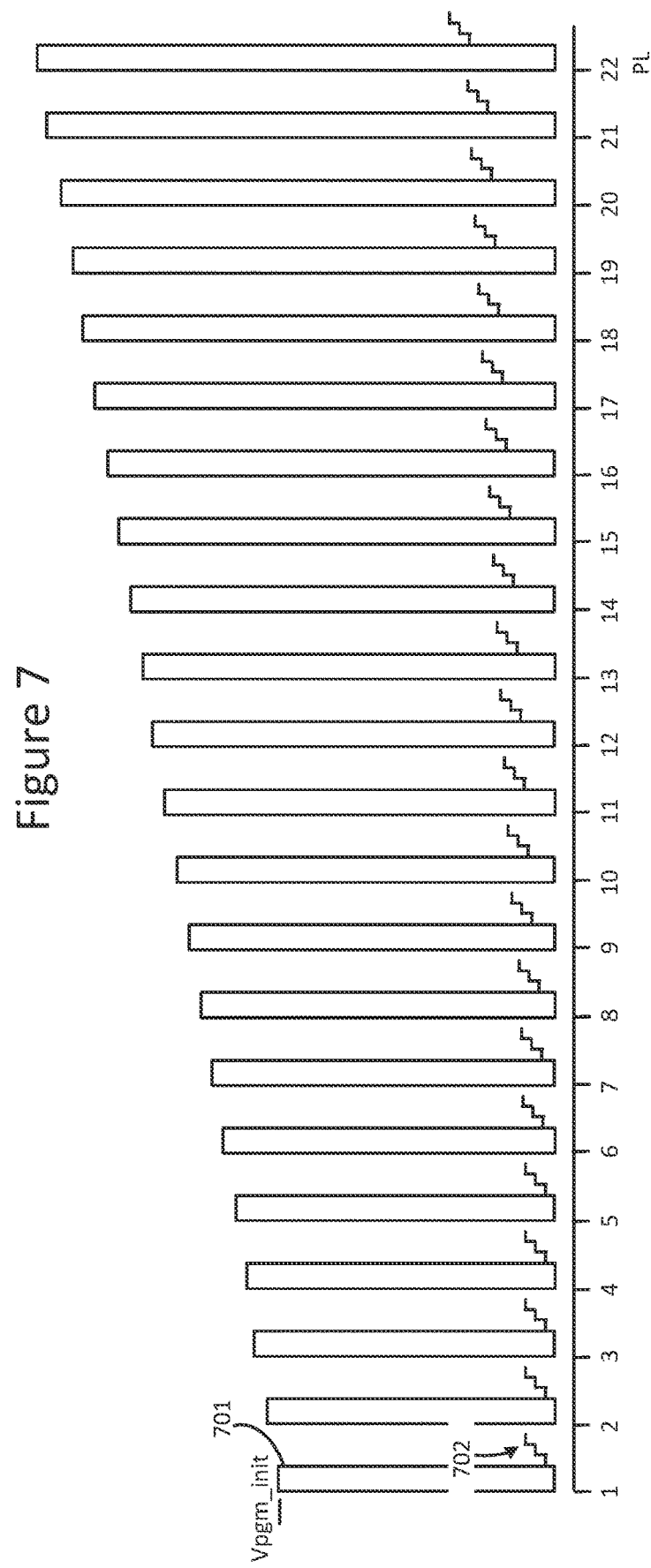

Figure 12

| Distribution | Digital value | Parity |
|---|---|---|
| S0 | 1111 | 0 |
| S1 | 0111 | 1 |
| S2 | 0101 | 0 |
| S3 | 1101 | 1 |
| S4 | 1100 | 0 |
| S5 | 0100 | 1 |
| S6 | 0000 | 0 |
| S7 | 0001 | 1 |
| S8 | 0011 | 0 |
| S9 | 0010 | 1 |
| S10 | 0110 | 0 |
| S11 | 1110 | 1 |
| S12 | 1010 | 0 |
| S13 | 1000 | 1 |
| S14 | 1001 | 0 |
| S15 | 1011 | 1 |

Figure 13C

| Read Level | Initial value | Parity | Recovered value |
|---|---|---|---|
| RL1 | 1111 | 0 | 1111 |
|  |  | 1 | 1110 |
| RL2 | 1110 | 1 | 1110 |
|  |  | 0 | 1010 |
| RL3 | 1010 | 0 | 1010 |
|  |  | 1 | 1000 |
| RL4 | 1000 | 1 | 1000 |
|  |  | 0 | 1001 |
| RL5 | 1001 | 0 | 1001 |
|  |  | 1 | 0001 |
| RL6 | 0001 | 1 | 0001 |
|  |  | 0 | 0000 |
| RL7 | 0000 | 0 | 0000 |
|  |  | 1 | 0010 |
| RL8 | 0010 | 1 | 0010 |
|  |  | 0 | 0110 |
| RL9 | 0110 | 0 | 0110 |
|  |  | 1 | 0100 |
| RL10 | 0100 | 1 | 0100 |
|  |  | 0 | 1100 |
| RL11 | 1100 | 0 | 1100 |
|  |  | 1 | 1101 |
| RL12 | 1101 | 1 | 1101 |
|  |  | 0 | 0101 |
| RL13 | 0101 | 0 | 0101 |
|  |  | 1 | 0111 |
| RL14 | 0111 | 1 | 0111 |
|  |  | 0 | 0011 |
| Remaining | 0011 | 0 | 0011 |
|  |  | 1 | 1011 |

Figure 13B

| Distribution | Digital value | Parity |
|---|---|---|
| S0 | 1111 | 0 |
| S1 | 1110 | 1 |
| S2 | 1010 | 0 |
| S3 | 1000 | 1 |
| S4 | 1001 | 0 |
| S5 | 0001 | 1 |
| S6 | 0000 | 0 |
| S7 | 0010 | 1 |
| S8 | 0110 | 0 |
| S9 | 0100 | 1 |
| S10 | 1100 | 0 |
| S11 | 1101 | 1 |
| S12 | 0101 | 0 |
| S13 | 0111 | 1 |
| S14 | 0011 | 0 |
| S15 | 1011 | 1 |

Figure 13D

| Initial value | | | | Parity (S) | Recovered Value | Logic Operation |
|---|---|---|---|---|---|---|
| T | C | B | A | | | |
| 1 | 1 | 1 |   | 0 | 1111 | If T&C&B&A&S then set A=0 |
| 1 |   | 1 | 0 | 1, 1 | 1110 | If T&C&B&!A&!S then set C=0 |
| 1 | 0 |   | 0 | 0, 0 | 1010 | If T&!C&B&!A&S then set B=0 |
| 1 | 0 | 0 |   | 1, 1 | 1000 | If T&!C&!B&!A&!S then set A=1 |
|   | 0 | 0 | 1 | 0, 0 | 1001 | If !T&C&B&!A&S then set T=0 |
| 0 | 0 | 0 |   | 1, 1 | 0001 | If !T&!C&!B&A&!S then set A=0 |
| 0 | 0 |   | 0 | 0, 0 | 0000 | If !T&!C&!B&!A&S then set B=1 |
| 0 |   | 1 | 0 | 1, 1 | 0010 | If !T&!C&B&!A&!S then set C=1 |
| 0 | 1 |   | 0 | 0, 0 | 0110 | If !T&C&B&!A&S then set B=0 |
|   | 1 | 0 | 0 | 1, 1 | 0100 | If !T&C&!B&!A&!S then set T=1 |
| 1 | 1 | 0 |   | 0, 0 | 1100 | If T&C&!B&!A&S then set A=1 |
|   | 1 | 0 | 1 | 1, 1 | 1101 | If T&C&!B&A&!S then set T=0 |
| 0 | 1 |   | 1 | 0, 0 | 0101 | If !T&C&!B&A&S then set B=1 |
| 0 |   | 1 | 1 | 1, 1 | 0111 | If !T&C&B&A&!S then set C=0 |
|   | 0 | 1 | 1 | 0, 0 | 0011 | If !T&!C&B&A&S then set T=1 |
| 1 | 0 | 1 | 1 | 1 | 1011 | Done |

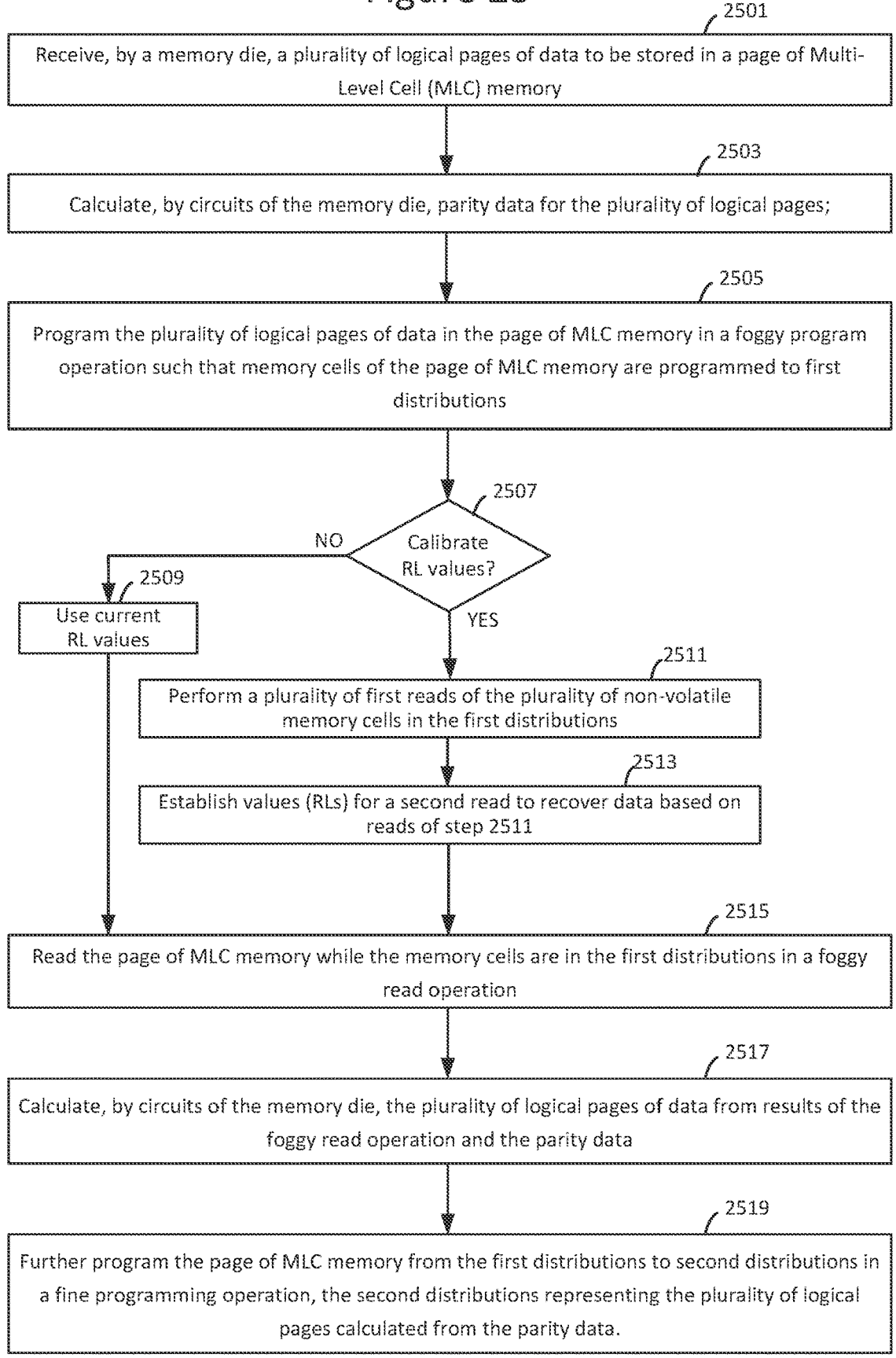

READ THRESHOLD CALIBRATION FOR NONVOLATILE MEMORY WITH ENCODED FOGGY-FINE PROGRAMMING

CLAIM OF PRIORITY

The present application claims priority from U.S. Provisional Patent Application No. 63/139,399, entitled "READ THRESHOLD CALIBRATION FOR NONVOLATILE MEMORY WITH ENCODED FOGGY-FINE PROGRAMMING," by Alrod et al., filed Jan. 20, 2021, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture, which comprises a stack of alternating conductive and dielectric layers.

A memory device includes memory cells that may be arranged in series, in NAND strings, for instance, where select gate transistors are provided at the ends of the NAND string to selectively connect a channel of the NAND string to a source line or bit line. However, various challenges are presented in operating such memory devices.

In some memory structures (e.g., NAND structures) that use charge-storing or charge-trapping material, programming of memory cells may disturb previously-programmed memory cells (e.g., charge added to a memory cell may affect nearby memory cells). To mitigate such program disturb effects, programming may occur in two or more program operations, with neighboring memory cells programmed (at least partially) between program operations. While this approach may mitigate program disturb effects, implementation may require significant data storage capacity to maintain data between program operations (e.g., before data is fully programmed in a NAND structure) and may incur significant overhead (e.g., significant movement of data between components for multiple program operations). Efficiently programming memory cells in multiple program operations may be challenging.

BRIEF DESCRIPTION OF THE DRAWINGS

FIG. 3A is a block diagram depicting one embodiment of the sense block 350 of FIG. 1E or 2A.

FIG. 3B depicts another example block diagram of the sense block 350 of FIG. 1E or 2A.

FIG. 6A depicts an example cross-sectional view of a portion of one of the blocks of FIG. 5.

FIG. 6B depicts an example variation in the width of the memory holes of FIG. 6A along their height.

FIG. 7 depicts an example of programming pulses in a program operation.

FIG. 12 illustrates an example of a mapping of threshold voltage distributions to digital values and parity bits.

FIG. 13B illustrates another example of mapping of threshold voltage distributions to digital values and parity bits.

FIG. 13C illustrates an example of read levels, initial digital values, and parity bits used to obtained recovered values in a foggy read scheme.

FIG. 13D illustrates an example of logic operations used to obtain recovered values in a foggy read scheme.

FIG. 25 is a flowchart for an embodiment of encoded foggy-fine operation that incorporates the calibration of the read voltage levels for reading of the foggy distributions.

DETAILED DESCRIPTION

Figure 1A:
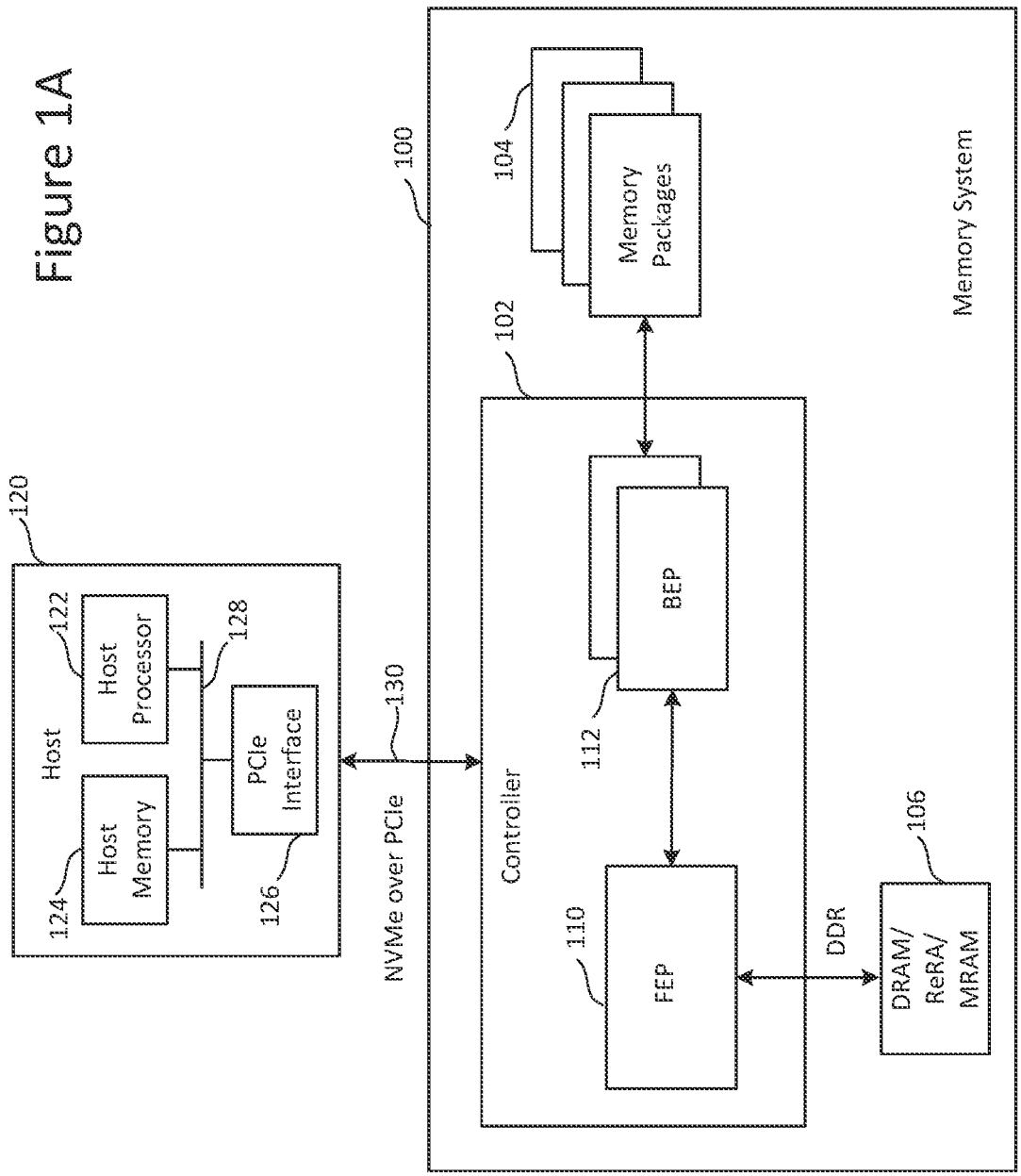
FIG. 1A is a block diagram of one embodiment of a memory system connected to a host.

Apparatuses and techniques are described for programming non-volatile memory cells, for example, non-volatile memory cells in a NAND or other multi-level cell (MLC) memory structure. In some cases, non-volatile memory cells are affected by programming of other non-volatile memory cells (e.g., nearby non-volatile memory cells along neighboring word lines). One technique to deal with such effects is to program non-volatile memory cells in two or more program operations, e.g., a first "foggy" program operation that leaves non-volatile memory cells in first distributions that are approximate, followed by a second "fine" program operation that brings the non-volatile memory cells to second distributions that are more accurate (e.g., narrower distributions), which may be used for long term storage. Between such foggy programming and subsequent fine programming, neighboring non-volatile memory cells may be programmed (at least foggy programmed) so that when fine programming occurs, charge is present in neighboring non-volatile memory cells and little or no further disturbance is caused by any further programming of neighboring non-volatile memory cells (e.g., fine programming may add relatively little additional charge so that effects of fine programming are not significant). A safe copy of data (e.g., in DRAM) may be maintained while the data is foggy programmed and not yet fine programmed. However, maintaining such data may require significant space in DRAM or other storage location. Also, accessing such data (to save and subsequently retrieve it) may use significant resources (e.g., may result in significant traffic on a bus between a memory die and DRAM).

In an example, data may be encoded prior to being foggy programmed (e.g., by generating parity data) so that when a read of foggy-programmed memory cells (in first distributions) is performed, the results of that read (a foggy read) may be decoded (e.g., combined with parity data) to recover the original data. In some cases, no safe copy may be needed when data is encoded and is recoverable from foggy-programmed memory cells and parity data. On-chip circuits may be provided to perform such encoding (e.g., XOR circuits) and decoding so that resources are efficiently used and excessive transfer of data (e.g., through memory bus) is avoided. Parity data may be stored on-chip in some cases (e.g., in a portion of a non-volatile memory structure that is configured for Single Level Cell (SLC) storage). In some cases, parity data may be corrected (decoded) by Error Correction Code (ECC) circuits prior to being used for recovery of data. Parity data may also be stored off-chip (e.g., in DRAM).

In some situations, such as an improper shutdown or extreme operating conditions, the data recovered from the foggy data states may have a high bit error rate and be unreliable. To more accurately recover the data values of the foggy data, the voltage levels used in reading the foggy data can provide more accurate results if they are properly calibrated. To this end, techniques are presented to optimize the read thresholds tailored to the multi-state encoded foggy-fine programming method. Due to the significant overlap between adjacent states when in the foggy state distributions, use of more standard read threshold calibration algorithms that are based on finding minima between states will not yield accurate results for the encoded foggy-fine distributions in the foggy state as this uses read values near the center of the distributions. Embodiments presented below instead present techniques to more accurately determine foggy read voltages near the centers of the foggy-programmed memory cell distributions.

FIG. 1A is a block diagram of one embodiment of a memory system 100 connected to a host 120. Memory system 100 can implement the technology presented herein for programming of multi-level memories. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1A comprises a controller 102, non-volatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, non-volatile memory, or another type of storage. Host 120 is external to and separate from memory system 100. In one embodiment, memory system 100 is embedded in host 120.

Figure 1B:
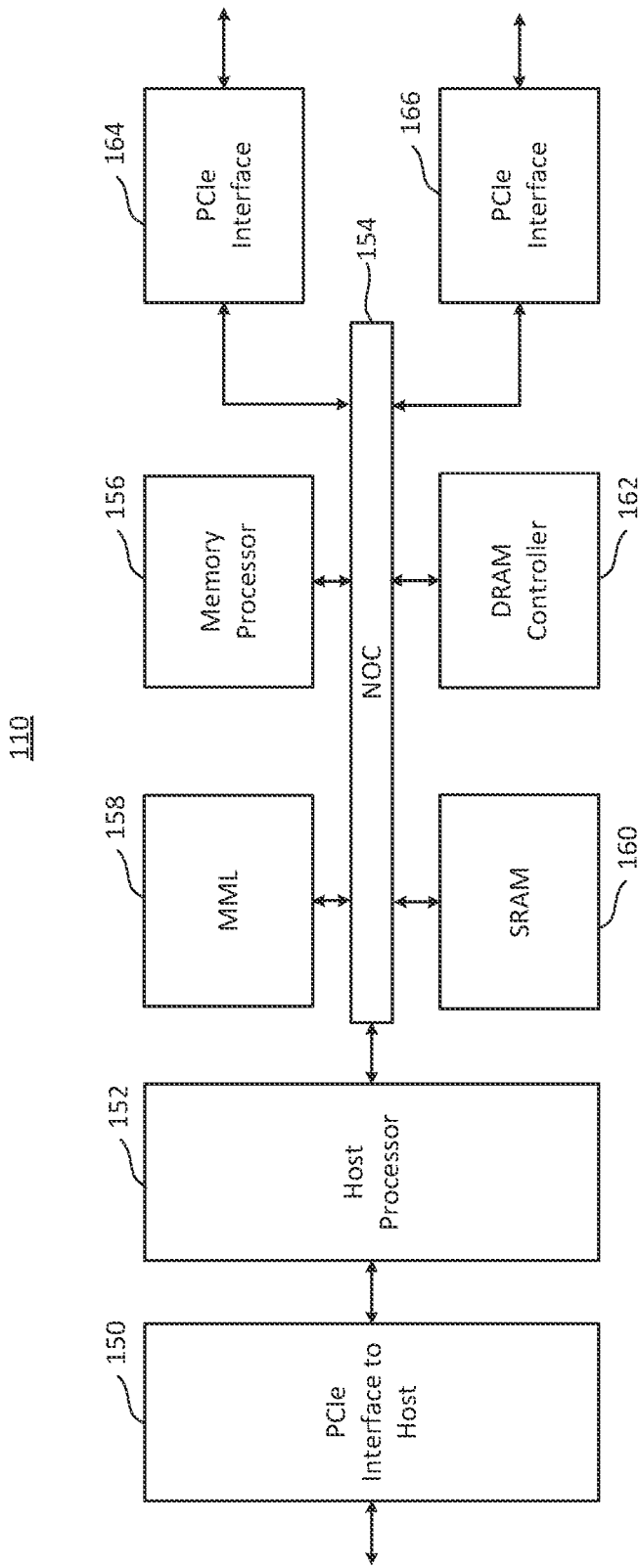
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 1B, the SSD controller will include two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIGS. 1E and 2A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

Figure 1C:
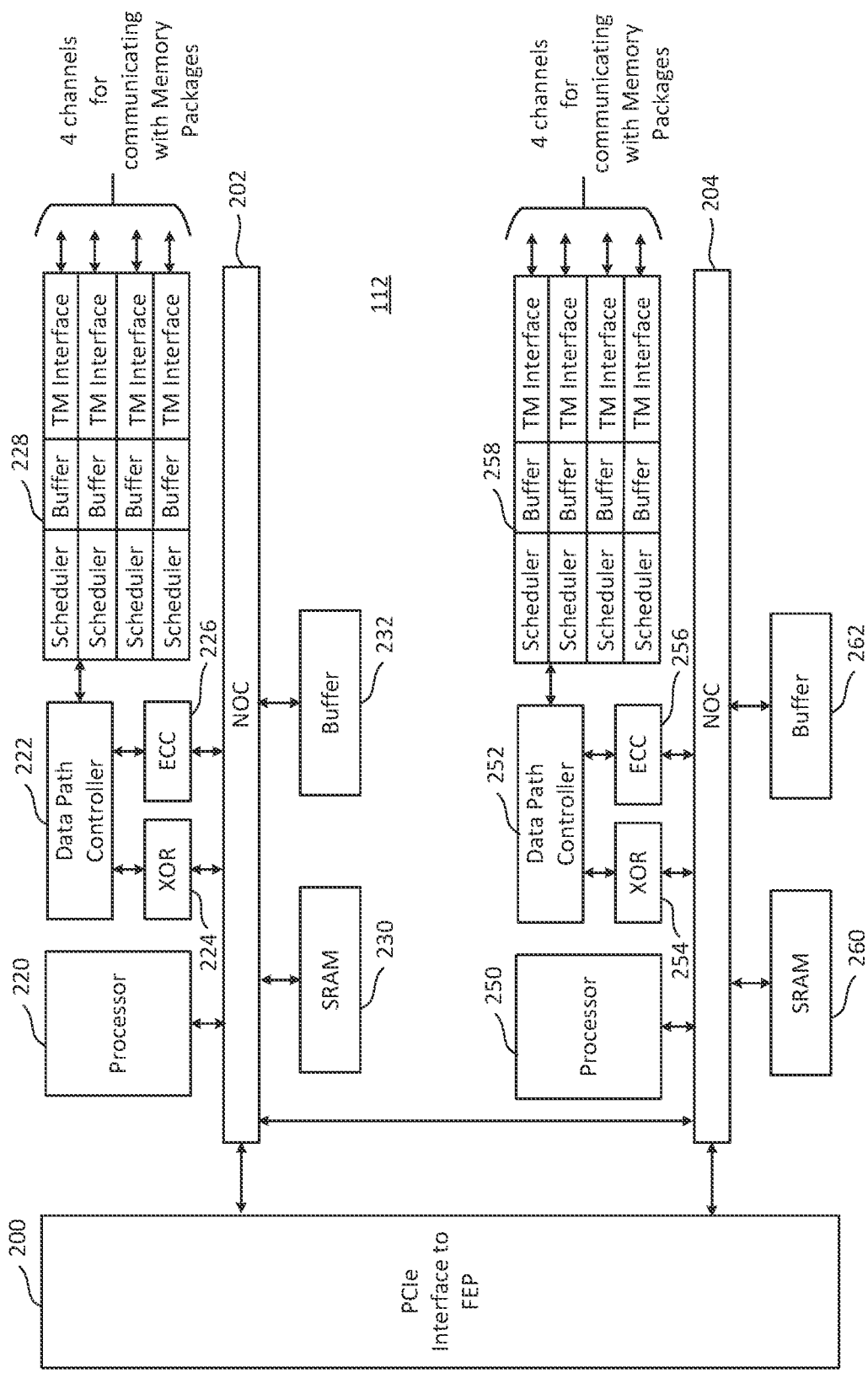
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
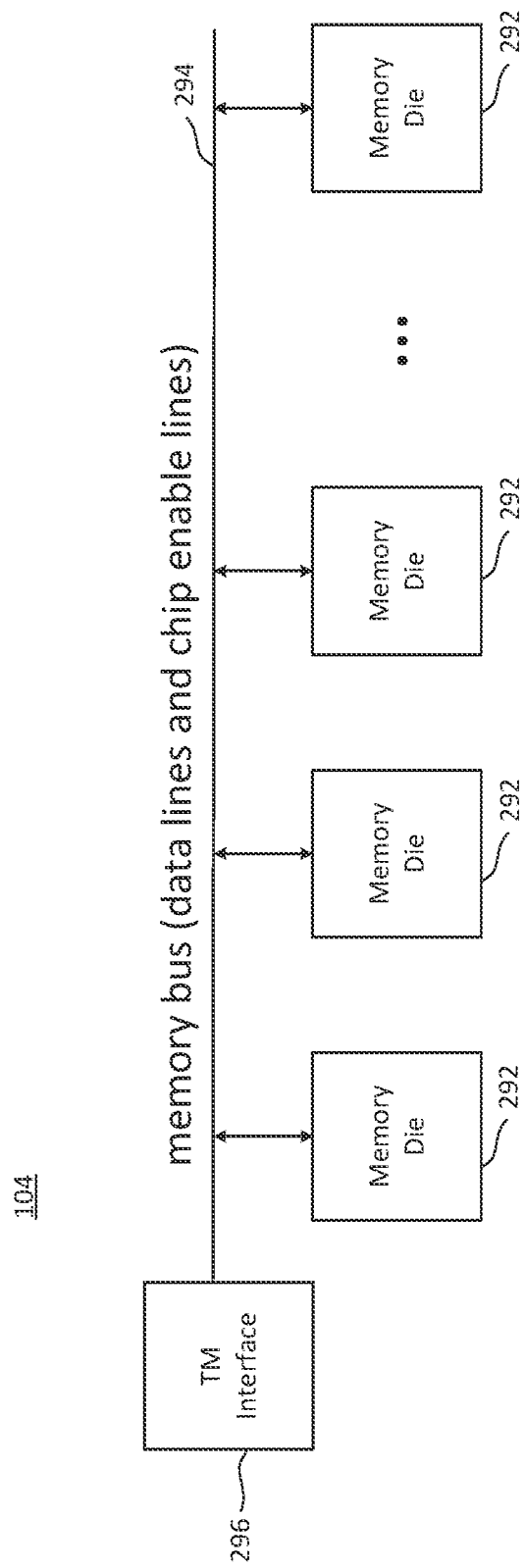
FIG. 1D is a block diagram of one embodiment of a memory package.

FIG. 1D is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 1E:
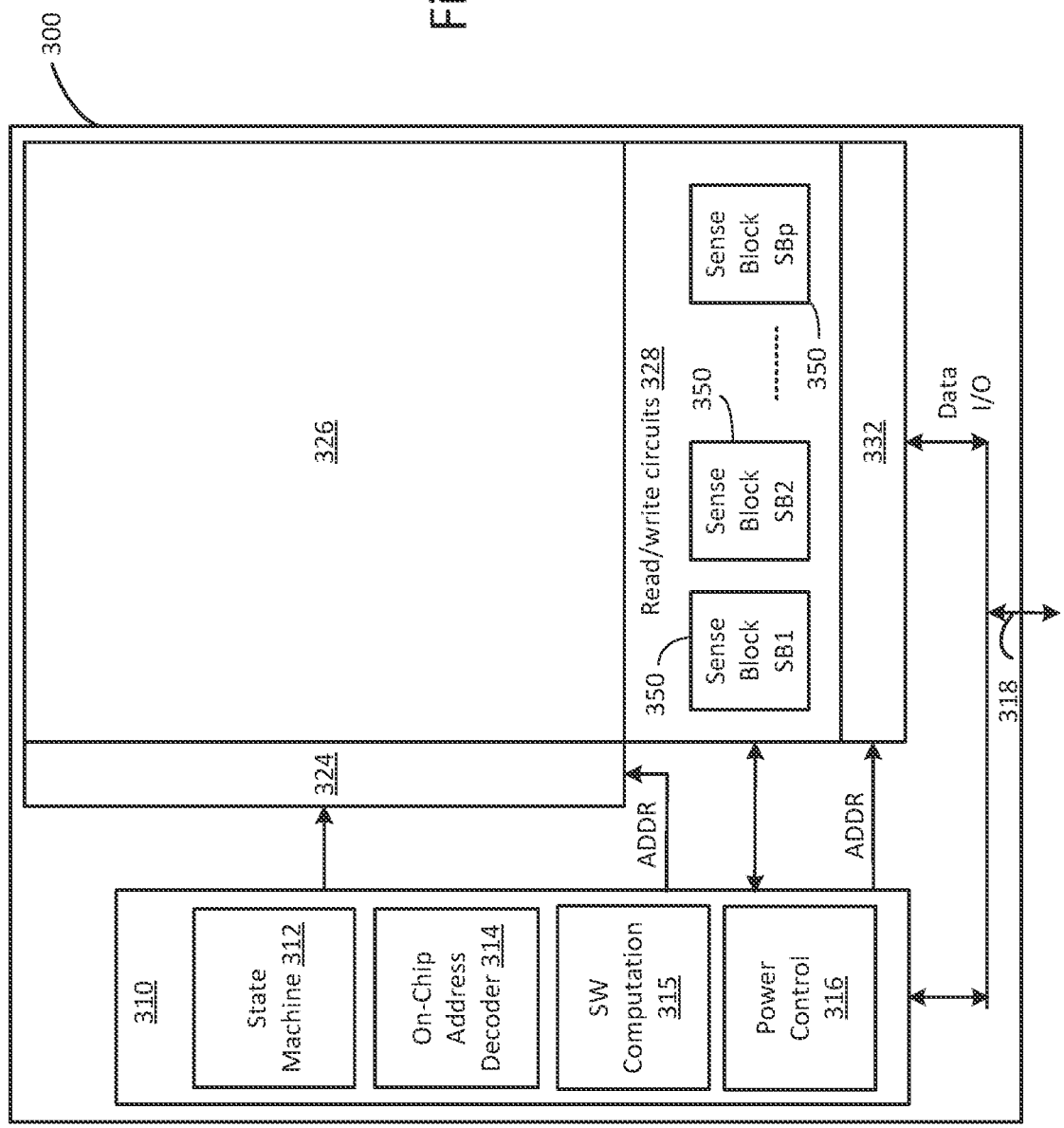
FIG. 1E is a block diagram of one embodiment of a memory die.

FIG. 1E is a functional block diagram of one embodiment of a memory die 300. The components depicted in FIG. 1E are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, and a power control circuit 316. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" can include a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM crosspoint memory includes reversible resistance-switching elements arranged in crosspoint arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive random access memory (MRAM) stores data by magnetic storage elements. The elements are formed from two ferromagnetic thin films, also known as layers, each of which are ferromagnetic, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 1E can be grouped into two parts, the memory structure 326 of the memory cells and the peripheral circuitry, including all of the other elements. An important characteristic of a memory circuit is its capacity, which can be increased by increasing the area of the memory die 300 that is given over to the memory structure 326; however, this reduces the area of the memory die 300 available for the peripheral circuitry. This can place quite severe restrictions on these peripheral elements. For example, the need to fit sense amplifier circuits within the available area can be a significant restriction on sense amplifier design architectures. With respect to the on-die control circuitry 310, reduced availability of area can limit the available functionalities that can be implemented on-chip. Consequently, a basic trade-off in the design of a memory die 300 is the amount of area to devote to the memory structure 326 and the amount of area to devote to the peripheral circuitry.

Another area in which the memory structure 326 and the peripheral circuitry are often at odds is in the processing involved in forming these regions, since these regions often involve differing processing technologies and the trade-off in having differing technologies on a single die. For example, when the memory structure 326 is NAND flash, this is an NMOS structure, while the peripheral circuitry is often CMOS based. For example, sense amplifier circuits in the sense blocks 350, charge pumps in the power control block 316, logic elements in the state machine 312, and other peripheral circuitry often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 1E onto separately formed dies that are then bonded together. More specifically, the memory structure 326 can be formed on one die and some or all of the peripheral circuitry elements, including one or more control circuits, can be formed on a separate die. For example, a memory die can be formed of just the memory elements, such as the array of memory cells of flash NAND memory, a PCM memory, a ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 2A:
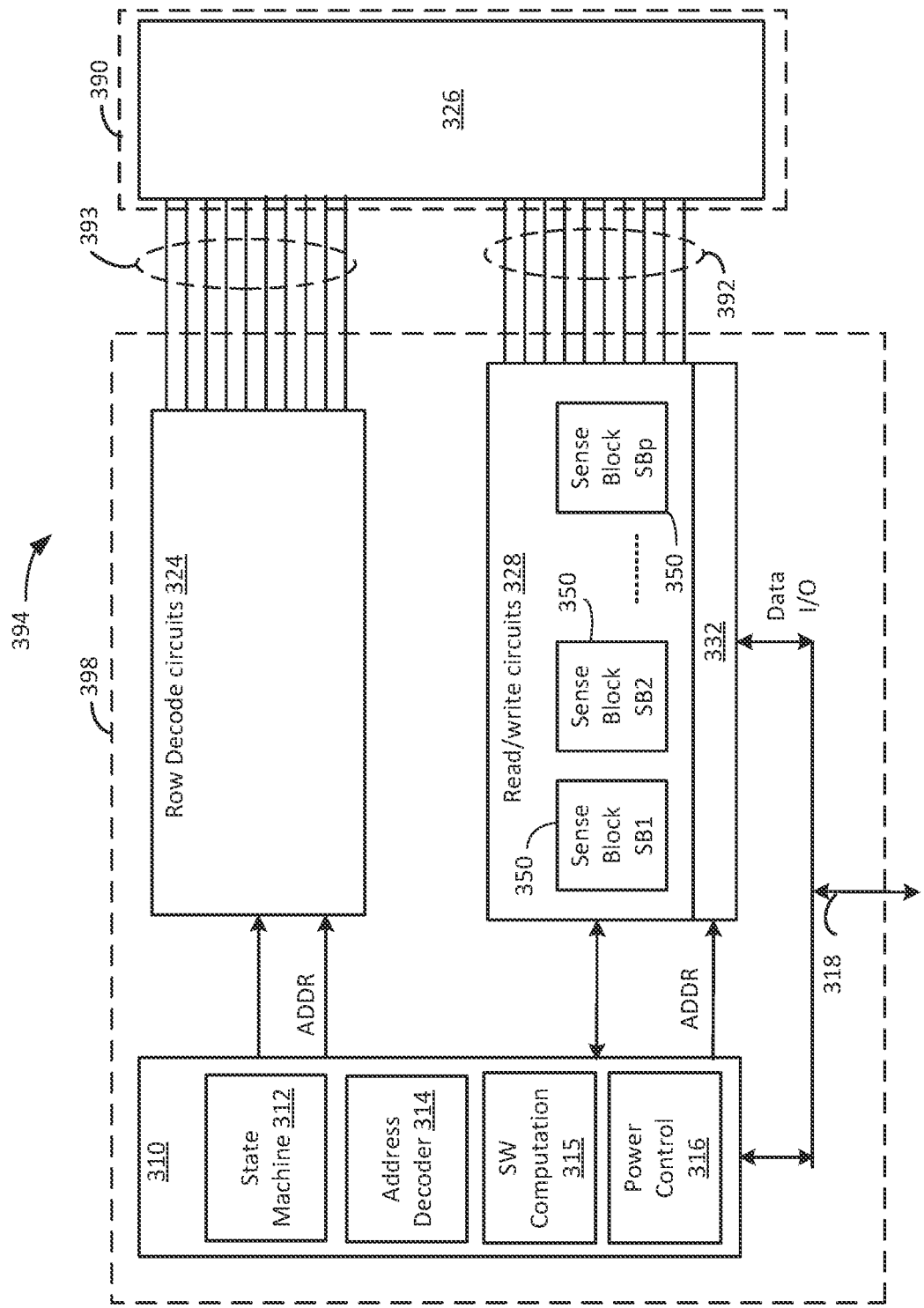
FIGS. 2A and 2B illustrate an example of control circuits coupled to a memory structure through wafer-to-wafer bonding.
Figure 2B:
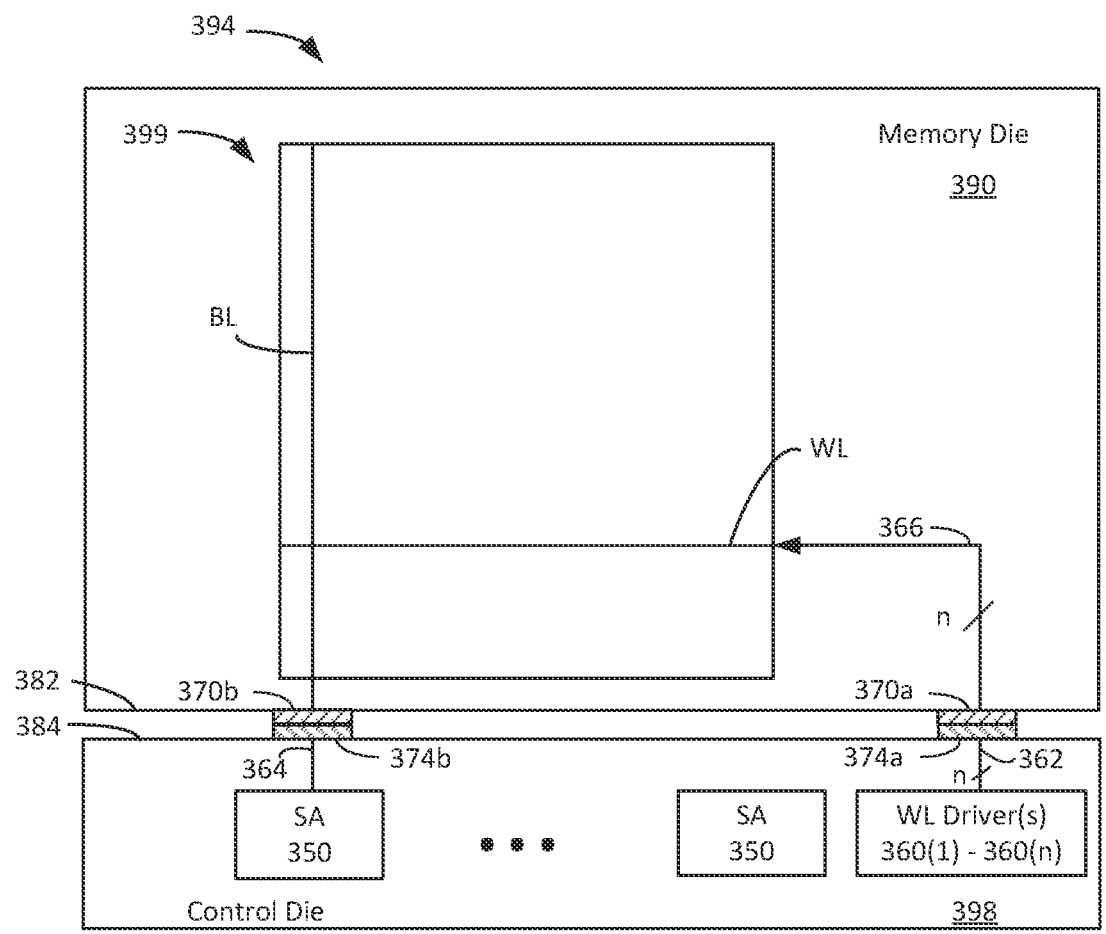

FIGS. 2A and 2B show an alternative arrangement to that of the single die memory device of FIG. 1E, which may be implemented using wafer-to-wafer bonding to provide a bonded die pair 394 for the memory device. FIG. 2A shows an example of the peripheral circuitry, including control circuits, formed in a peripheral circuit or control die 398 coupled to memory structure 326 formed in memory die 390. Common components are numbered as in FIG. 1E. It can be seen that control circuitry 310, read/write circuits 328, and row decoder 324 (which may be formed by a CMOS process) are located in control die 398 Additional elements, such as functionalities from controller 102 can also be moved into the control die 398. Control circuitry 310, read/write circuits 328, row decoder 324, and column decoder 332 may be formed by a common process (e.g., CMOS process), so that adding elements and functionalities more typically found on a memory controller 102 may require few or no additional process steps (i.e., the same process steps used to fabricate controller 102 may also be used to fabricate control circuitry 310, read/write circuits 328, and row decoder 324). Thus, while moving such circuits from a die such as memory die 300 may reduce the number of steps needed to fabricate such a die, adding such circuits to a die such as control die 398 may not require any additional process steps.

FIG. 2A shows read/write circuits 328 on the control die 398 coupled to memory structure 326 on the memory die 390 through electrical paths 392. For example, electrical paths 392 may provide electrical connection between read/write circuits 328 and bit lines of memory structure 326. Electrical paths may extend from read/write circuits 328 in control die 398 through pads on control die 398 that are bonded to corresponding pads of the memory die 390, which are connected to bit lines of memory structure 326. Each bit line of memory structure 326 may have a corresponding electrical path in electrical paths 392, including a pair of bonded pads, that connects to read/write circuits 328. Similarly, row decoder circuits 324 are coupled to memory structure 326 through electrical paths 393. Each of electrical path 393 may correspond to a word line, dummy word line, or select gate line. Additional electrical paths may also be provided between control die 398 and memory die 390.

FIG. 2B is a block diagram showing more detail on the arrangement of one embodiment of the integrated memory assembly of bonded die pair 394. Memory die 390 contains a plane 399 or array of memory cells. The memory die 390 may have additional planes or arrays. One representative bit line (BL) and representative word line (WL) is depicted for each plane or array 399. There may be thousands or tens of thousands of such bit lines per each plane or array 399. In one embodiment, an array or plane represents a groups of connected memory cells that share a common set of unbroken word lines and unbroken bit lines.

Control die 398 includes a number of sense amplifiers (SA) 350. Each sense amplifier 350 is connected to one bit line or may be connected to multiple bit lines in some embodiments. The sense amplifier contains a bit line driver. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 398 includes a number of word line drivers 360(1)-360(n). The word line drivers 360 are configured to provide voltages to word lines. In this example, there are "n" word lines per array or plane memory cells. If the memory operation is a program or read, one word line within the selected block is selected for the memory operation, in one embodiment. If the memory operation is an erase, all of the word lines within the selected block are selected for the erase, in one embodiment. The word line drivers 360 (e.g., part of Power Control 316) provide voltages to the word lines in memory die 390. As discussed above with respect to FIG. 2A, the control die 398 may also include charge pumps, voltage generators, and the like that are not represented in FIG. 2B, which may be used to provide voltages for the word line drivers 360 and/or the bit line drivers.

The memory die 390 has a number of bond pads 370a, 370b on a first major surface 382 of memory die 390. There may be "n" bond pads 370a, to receive voltages from a corresponding "n" word line drivers 360(1)-360(n). There may be one bond pad 370b for each bit line associated with plane 399. The reference numeral 370 will be used to refer in general to bond pads on major surface 382.

In some embodiments, each data bit and each parity bit of a codeword are transferred through a different bond pad pair 370b, 374b. The bits of the codeword may be transferred in parallel over the bond pad pairs 370b, 374b. This provides for a very efficient data transfer relative to, for example, transferring data between the memory controller 102 and the integrated memory assembly 394. For example, the data bus between the memory controller 102 and the integrated memory assembly 394 may, for example, provide for eight, sixteen, or perhaps 32 bits to be transferred in parallel. However, the data bus between the memory controller 102 and the integrated memory assembly 394 is not limited to these examples.

The control die 398 has a number of bond pads 374a, 374b on a first major surface 384 of control die 398. There may be "n" bond pads 374a, to deliver voltages from a corresponding "n" word line drivers 360(1)-360(n) to memory die 390. There may be one bond pad 374b for each bit line associated with plane 399. The reference numeral 374 will be used to refer in general to bond pads on major surface 382. Note that there may be bond pad pairs 370a/374a and bond pad pairs 370b/374b. In some embodiments, bond pads 370 and/or 374 are flip-chip bond pads.

In one embodiment, the pattern of bond pads 370 matches the pattern of bond pads 374. Bond pads 370 are bonded (e.g., flip chip bonded) to bond pads 374. Thus, the bond pads 370, 374 electrically and physically couple the memory die 390 to the control die 398.

Also, the bond pads 370, 374 permit internal signal transfer between the memory die 390 and the control die 398. Thus, the memory die 390 and the control die 398 are bonded together with bond pads. Although FIG. 2A depicts one control die 398 bonded to one memory die 390, in another embodiment one control die 398 is bonded to multiple memory dies 390.

Herein, "internal signal transfer" means signal transfer between the control die 398 and the memory die 390. The internal signal transfer permits the circuitry on the control die 398 to control memory operations in the memory die 390. Therefore, the bond pads 370, 374 may be used for memory operation signal transfer. Herein, "memory operation signal transfer" refers to any signals that pertain to a memory operation in a memory die 390. A memory operation signal transfer could include, but is not limited to, providing a voltage, providing a current, receiving a voltage, receiving a current, sensing a voltage, and/or sensing a current.

The bond pads 370, 374 may be formed for example of copper, aluminum, and alloys thereof. There may be a liner between the bond pads 370, 374 and the major surfaces (382, 384). The liner may be formed for example of a titanium/titanium nitride stack. The bond pads 370, 374 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 370, 374. Several conductive pathways, which may be implemented with metal interconnects and/or vias are depicted. For example, a sense amplifier 350 may be electrically connected to bond pad 374b by pathway 364. Relative to FIG. 2A, the electrical paths 392 can correspond to pathway 364, bond pads 374b, and bond pads 370b. There may be thousands of such sense amplifiers, pathways, and bond pads. Note that the BL does not necessarily make direct connection to bond pad 370b. The word line drivers 360 may be electrically connected to bond pads 374a by pathways 362. Relative to FIG. 2A, the electrical paths 393 can correspond to the pathway 362, the bond pads 374a, and bond pads 370a. Note that pathways 362 may comprise a separate conductive pathway for each word line driver 360(1)-360(n). Likewise, a there may be a separate bond pad 374a for each word line driver 360(1)-360(n). The word lines in block 2 of the memory die 390 may be electrically connected to bond pads 370a by pathways 364. In FIG. 2B, there are "n" pathways 364, for a corresponding "n" word lines in a block. There may be separate pair of bond pads 370a, 374a for each pathway 364.

Relative to FIG. 1E, the on-die control circuits of FIG. 2A can also include addition functionalities within its logic elements, both more general capabilities than are typically found in the memory controller 102 and some CPU capabilities, but also application specific features, such as Error Correction Code (ECC).

In the following, state machine 312 and/or controller 102 (or equivalently functioned circuits), in combination with all or a subset of the other circuits depicted on the control die 398 in FIG. 2A and similar elements in FIG. 1E, can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory structure 326 of FIGS. 1E and 2A will mainly be discussed in the context of a three dimensional NAND flash memory, although much of the discussion can be applied more generally. Techniques are presented for foggy-fine programming of multi-level cells (MLC), which are a common implementation of three dimensional NAND flash memory, but can also be applied to other memory technologies when programming multi-state memory values.

FIG. 3A is a block diagram depicting one embodiment of the sense block 350 of FIG. 1E or 2A. An individual sense block 350 is partitioned into one or more core portions, referred to as sense circuits 480-483 or sense amplifiers, and a common portion, referred to as a managing circuit 490. In one embodiment, there will be a separate sense circuit for each bit line/NAND string and one common managing circuit 490 for a set of multiple, e.g., four or eight, sense circuits. Each of the sense circuits in a group communicates with the associated managing circuit via data bus 472. Thus, there are one or more managing circuits which communicate with the sense circuits of a set of storage elements.

The sense circuit 480, as an example, comprises sense circuitry 470 that performs sensing by determining whether a conduction current in a connected bit line is above or below a predetermined threshold level. Sense circuit 480 also includes a bit line latch 484 that is used to set a voltage condition on the connected bit line. For example, a predetermined state latched in the bit line latch will result in the connected bit line being pulled to a state designating program inhibit (e.g., 1.5-3 V). As an example, a flag=0 can inhibit programming, while flag=1 does not inhibit programming.

The managing circuit 490 comprises a processor 492, four example sets of data latches 494-497 and an I/O interface 498 coupled between the set of data latches 494 and data bus 120. One set of data latches, e.g., T, C, B, A, can be provided for each sense circuit. In some cases, additional data latches may be used. Each set of latches T, C, B, A may correspond to a different logical page of data for programming together to a set of non-volatile memory cells. This is in a sixteen-level or four-bit per storage element memory device. One additional data latch per bit line can be provided for each additional data bit per storage element.

The processor 492 performs computations, such as to determine the data stored in the sensed storage element and store the determined data in the set of data latches. Each set of data latches 494-497 is used to store data bits determined by processor 492 during a read operation, and to store data bits imported from the data bus 120 during a program operation which represent write data meant to be programmed into the memory. I/O interface 498 provides an interface between data latches 494-497 and the data bus 120.

During reading and verifying, the operation of the system is under the control of state machine 112 that controls the supply of different control gate voltages to the addressed storage element. As it steps through the various predefined control gate voltages corresponding to the various memory states supported by the memory, the sense circuit 480 may trip at one of these voltages and a corresponding output will be provided from sense circuit 480 to processor 492 via bus 472. At that point, processor 492 determines the resultant memory state by consideration of the tripping event(s) of the sense circuit and the information about the applied control gate voltage from the state machine via input lines 493. It then computes a binary encoding for the memory state and stores the resultant data bits into data latches 494-497. In another embodiment of the managing circuit 490, bit line latch serves double duty, both as a latch for latching the output of the sense circuit 480 and also as a bit line latch as described above.

Some implementations can include multiple processors 492. In one embodiment, each processor 492 will include an output line (not depicted) such that each of the output lines is wired-OR-ed together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 492 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 494-497 from the data bus 120. In a four-bit per storage element implementation (Quad-Level Cell or QLC), four data latches (T, C, B, A) may be used. The program operation, under the control of the state machine, comprises a series of programming voltage pulses applied to the control gates of the addressed storage elements. Each program voltage is followed by a read back (verify) to determine if the storage element has been programmed to the desired memory state. In some cases, processor 492 monitors the read back memory state relative to the desired memory state. When the two are in agreement, the processor 492 sets the bit line latch so as to cause the bit line to be pulled to a state designating program inhibit. This inhibits the storage element coupled to the bit line from further programming even if program pulses appear on its control gate. In other embodiments the processor initially loads the bit line latch and the sense circuit sets it to an inhibit value during the verify process.

Each set of data latches 494-497 may be implemented as a stack of data latches for each sense circuit. In one embodiment, there are four or more data latches per sense circuit 480. In some implementations, the data latches are implemented as a shift register so that the parallel data stored therein is converted to serial data for data bus 420, and vice versa. All the data latches corresponding to the read/write block of storage elements can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated storage element has reached certain mileposts in a program operation. For example, latches may identify that a storage element's Vth is below a particular verify level. The data latches indicate whether a storage element currently stores one or more bits from a page of data.

FIG. 3B depicts another example block diagram of the sense block 350. The column control circuitry can include multiple sense blocks, where each sense block performs sensing, e.g., read, program verify, or erase verify operations for multiple memory cells via respective bit lines. In one approach, a sense block comprises multiple sense circuits, also referred to as sense amplifiers. Each sense circuit is associated with data latches and caches. For example, the example sense circuits 450a, 451a, 452a and 453a are associated with caches 450c, 451c, 452c and 453c, respectively.

In one approach, different subsets of bit lines can be sensed using different respective sense blocks. This allows the processing load which is associated with the sense circuits to be divided up and handled by a respective processor in each sense block. For example, a sense circuit controller 460 can communicate with the set, e.g., sixteen, of sense circuits and latches. The sense circuit controller may include a pre-charge circuit 461 which provides a voltage to each sense circuit for setting a pre-charge voltage. The sense circuit controller may also include a memory 462 and a processor 463.

Figure 4:
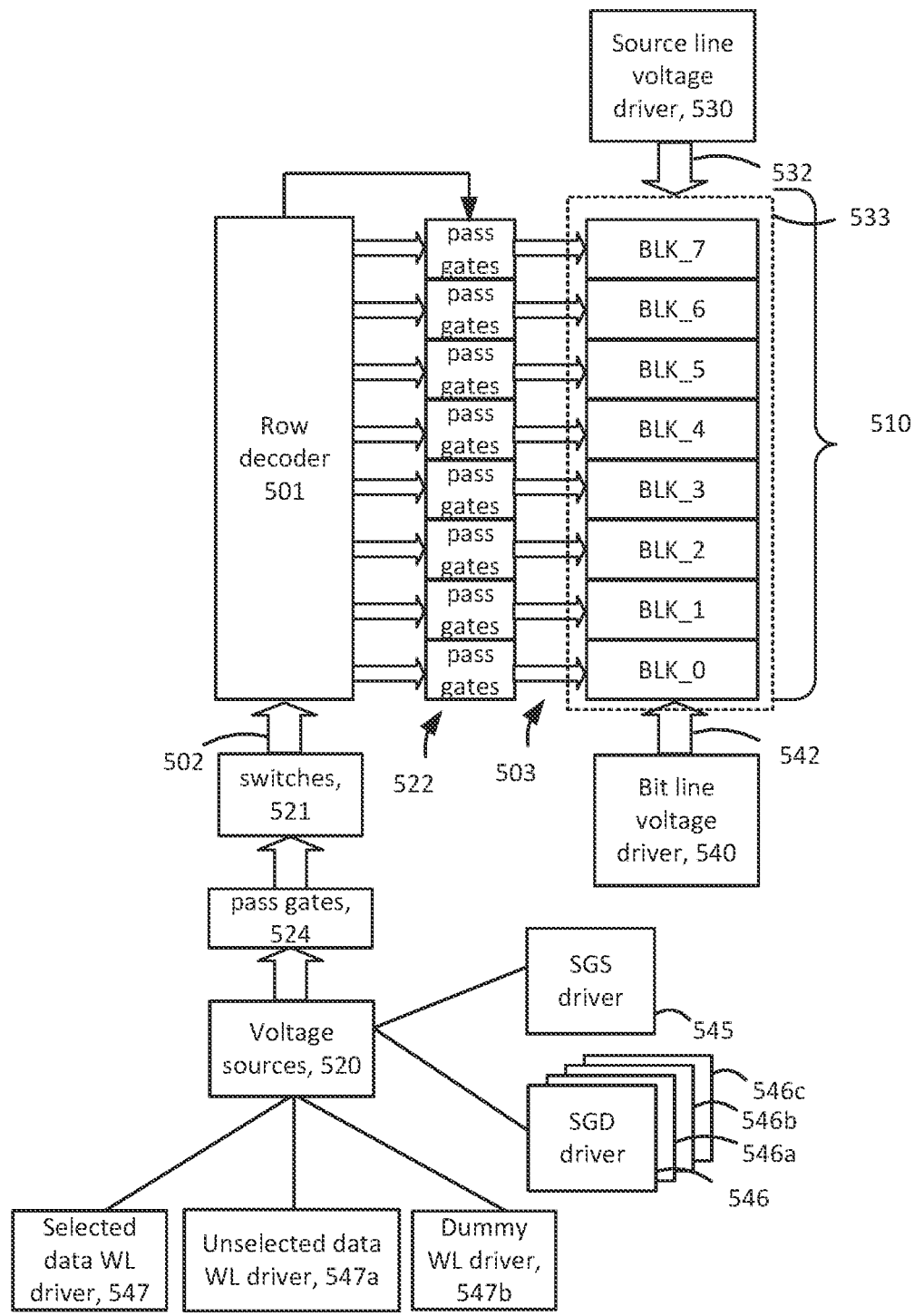
FIG. 4 depicts an example circuit for providing voltages to blocks of memory cells.

FIG. 4 depicts an example circuit for providing voltages to blocks of memory cells. In this example, a row decoder 501 provides voltages to word lines and select gates of each block in set of blocks 510. The blocks could be in a plane and includes blocks BLK_0 to BLK_7. The row decoder provides a control signal to pass transistors 522 which connect the blocks to the row decoder. Typically, program or read operations are performed on one selected block at a time and on one selected sub-block of the block. An erase operation may be performed on a selected block or sub-block. The row decoder and pass gates can connect global control lines 502 to local control lines 503. The control lines represent conductive paths. Voltages are provided on the global control lines from voltage sources 520 to pass transistors 522. The voltage sources may provide voltages to switches 521 which connect to the global control lines. Pass transistors 524 are controlled to pass voltages from the voltage sources 520 to the switches 521.

The voltage sources 520 can provide voltages on word lines (WL), SGS control gates and SGD control gates, for example. The voltage sources can include a selected word line (WL) driver 547, which provides a voltage on a word line selected during a program or read operation, a driver 547a for unselected data word lines, and a dummy word line driver 547b which provides voltages on dummy word lines.

The voltage sources can also include a common SGS driver 545 and separate SGD drivers for each sub-block. For example, SGD drivers 546, 546a, 546b and 546c can be provided for SB0, SB1, SB2 and SB3, respectively. In another option, a separate SGS driver is provided for each sub-block.

The various components, including the row decoder, may receive commands from a controller such as the state machine 112 or the controller 122 to perform the functions described herein.

A source line voltage source 530 provides the voltage Vsl to the source lines/diffusion region in the substrate via control lines 532. In one approach, the source diffusion region 533 is common to the blocks. A set of bit lines 542 is also shared by the blocks. A bit line voltage source 540 provides voltages to the bit lines.

Figure 5:
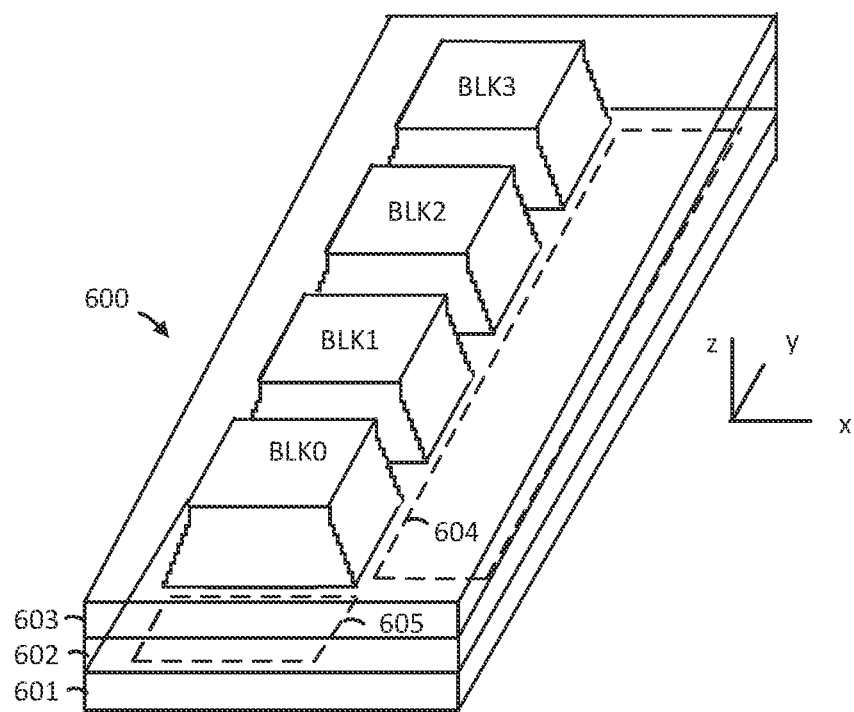
FIG. 5 is a perspective view of a memory device 600 comprising a set of blocks in an example 3D configuration of the memory structure 326 of FIG. 1E or 2A.

FIG. 5 is a perspective view of a memory device 600 comprising a set of blocks in an example 3D configuration of the memory structure 326 of FIG. 1E or 2A. On the substrate are example blocks BLK0, BLK1, BLK2 and BLK3 of memory cells (storage elements) and peripheral areas with circuitry for use by the blocks. The peripheral area 604 runs along an edge of each block while the peripheral area 605 is at an end of the set of blocks. The pass transistors for a voltage driver of the SGS transistors may be located in this peripheral area 605, in one approach. In this case, the blocks BLK0, BLK1, BLK2 and BLK3 are at progressively further distances from the pass transistors. The circuitry can include voltage drivers which can be connected to control gate layers, bit lines and source lines of the blocks. In one approach, control gate layers at a common height in the blocks are commonly driven. The substrate 601 can also carry circuitry under the blocks, and one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6C:
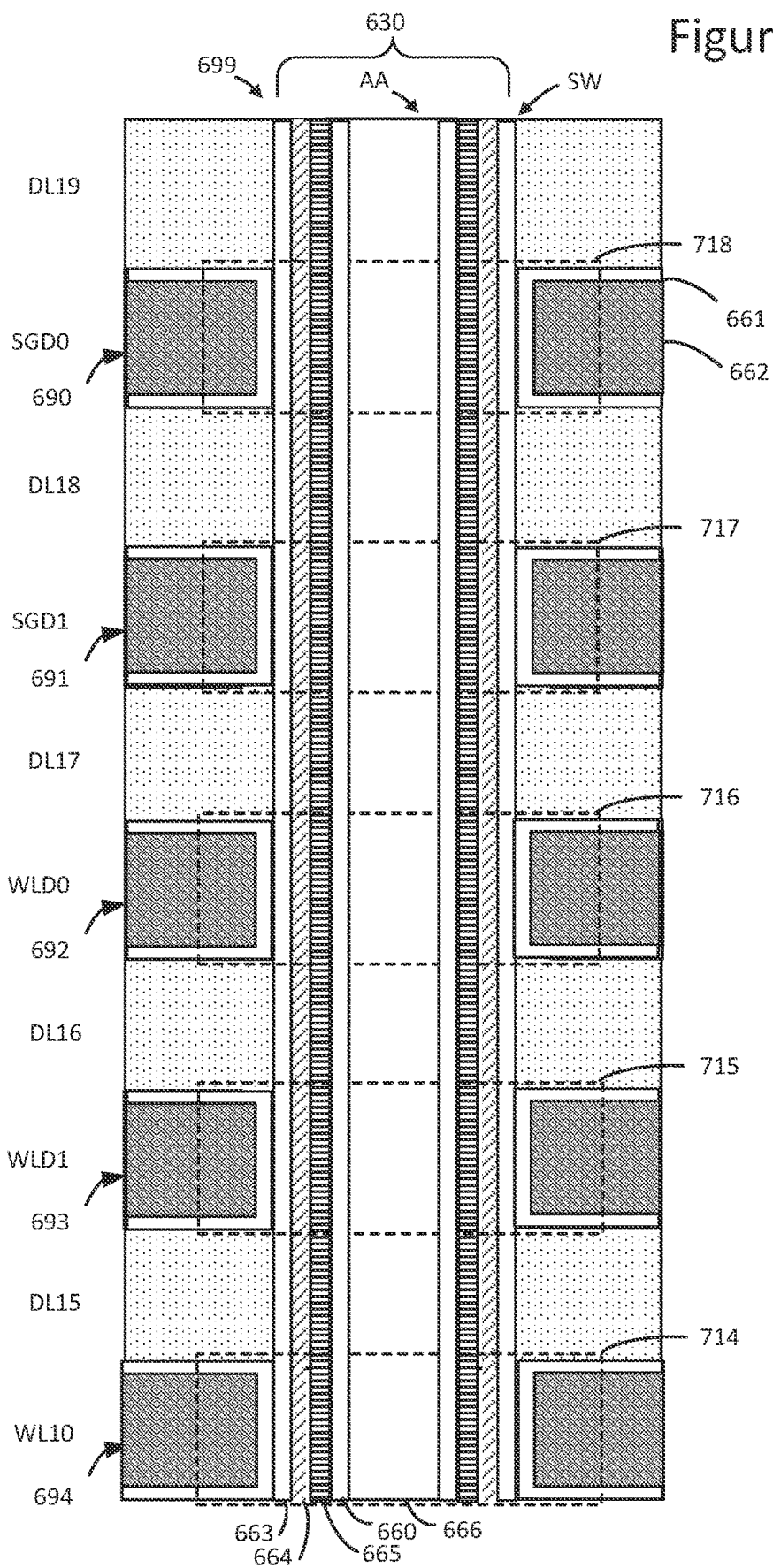
FIG. 6C depicts a close-up view of the region 622 of the stack of FIG. 6A.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source-side dummy word line layers (or word lines) WLS1 and WLS0, two drain-side dummy word line layers WLD1 and WLD0, and eleven data word line layers (or data word lines) WL0-WL10. WL0 is a source-side data word line and WLS1 is a dummy word line layer which is adjacent to the source-side data word line. WLS0 is another dummy word line layer which is adjacent to WLS1. WL10 is a drain-side data word line and WLD1 is a dummy word line layer which is adjacent to the drain-side data word line. WLD0 is another dummy word line layer which is adjacent to WLD1. The dielectric layers are labelled as DL1-DL19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation. The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts an example variation in the width of the memory holes of FIG. 6A along their height. Due to the etching process used to create the memory holes, and the very high aspect ratio, the cross-sectional width, e.g., diameter, of a memory hole can vary along its height. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

FIG. 6C depicts a close-up view of the region 622 of the stack of FIG. 6A. Memory cells are formed at the different levels of the stack at the intersection of a word line layer and a memory hole. In this example, SGD transistors 718 and 717 are provided above dummy memory cells 716 and 715 and a data memory cell 714. A number of layers can be deposited along the sidewall (SW) of the memory hole 630 and/or within each word line layer, e.g., using atomic layer deposition. For example, each pillar 699 or column which is formed by the materials within a memory hole can include a blocking oxide layer 663, a charge-trapping layer 664 or film such as silicon nitride ($Si_3N_4$) or other nitride, a tunneling layer 665, a channel 660 (e.g., comprising polysilicon), and a dielectric core 666. A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string comprises a channel which extends continuously from one or more source-end select gate transistors to one or more drain-end select gate transistors.

FIG. 7 depicts a voltage signal used in a series of program loops in an example program operation. The horizontal axis denotes a program loop (PL) number, ranging from 1-22, and the vertical axis denotes voltage. During a program operation, program loops are performed for a selected word line in a selected block in each plane. A program loop comprises a program portion in which a program voltage or pulse is applied to the selected word line followed by a verify portion in which a verify signal is applied to the selected word line while one or more verify tests are performed for the associated memory cells. Other than the erased state, each assigned state has a verify voltage which is used in the verify test for the state in a program operation.

The voltage signal 700 includes a series of program voltages, including an initial program voltage 701, which are applied to a word line selected for programming. In this example, the voltage signal includes program voltages which increase stepwise in amplitude in one or more program loops of a programming pass using a fixed or varying step size. This is referred to as incremental step pulse programming, where the program voltage starts at an initial level Vpgm_int (see initial program voltage 701) and increases in a step in each successive program loop, for instance, until the program operation is completed. A successful completion occurs when the threshold voltages of the selected memory cells reach the verify voltages of the assigned data states.

A program operation can include a single programming pass or multiple programming passes, where each pass uses incremental step pulse programming, for instance.

The verify signal in each program loop, including example verify signal 702, can include one or more verify voltages, based on the assigned data states which are being verified for the program loop. The verify tests can encompass lower assigned data states and then midrange assigned data states and then higher assigned data states as the program operations proceeds. The example verify signals depict three verify voltages as a simplification.

All memory cells may initially be in the erased state at the beginning of the program operation, for instance. After the program operation is completed, the data can be read from the memory cells using read voltages which are between the Vth distributions. At the same time, a read pass voltage, Vpass (e.g., 8-10 V), also referred to as a pass voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two logical pages of data can be stored together in a page. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. Memories that store more than one bit per cell may be referred to as MLC memory, which includes Three Level Cell (TLC) memory (storing three bits per cell using eight data states) and QLC memory (storing four bits per cell using sixteen data states). Memories that store one bit per cell using two data states may be referred to as SLC memory.

Figure 8:
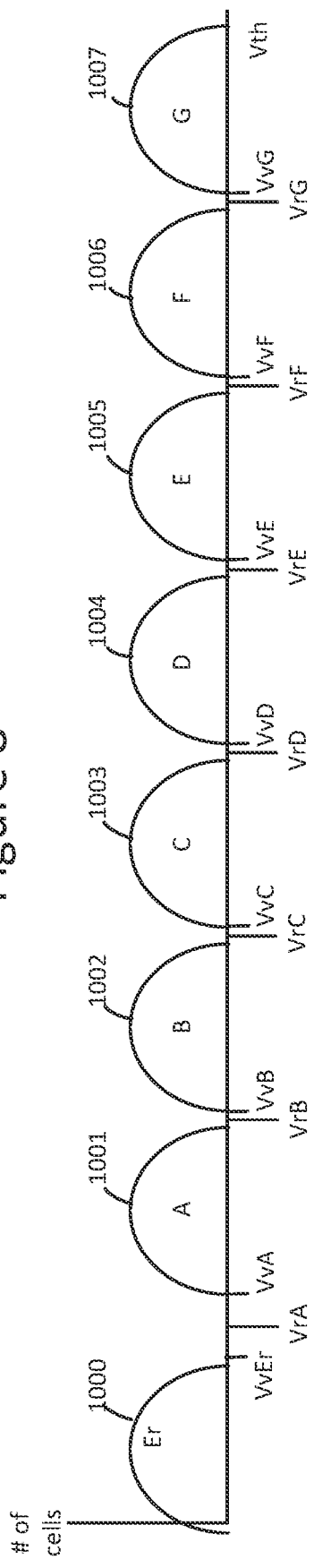
FIG. 8 depicts an example of memory cell threshold voltages of a plurality of memory cells programmed to different data states to store data.

FIG. 8 depicts an example Vth distribution of sets of memory cells after a program operation in a set of memory cells with eight data states, or three bits per cell. The vertical axis depicts a number of memory cells, on a logarithmic scale, and the horizontal axis depicts a Vth of the memory cells on a linear scale. In one approach, at a start of the program operation, the memory cells are all initially in the erased state 1000. After the program operation is successfully completed, the memory cells assigned to the Er state may be upshifted due to some amount of program disturb which normally occurs.

The memory cells which are to be programmed to the A, B, C, D, E, F and G states using verify voltages of VvA, VvB, VvC, VvD, VvE, VvF and VvG, respectively, are represented by the Vth distributions 1001, 1002, 1003, 1004, 1005, 1006 and 1007, respectively. Read voltages VrA, VrB, VrC, VrD, VrE, VrF and VrG can be used for reading the states of the memory cells in a read operation. These verify voltages and read voltages are examples of control gate read levels of the selected word line voltage.

After data is stored for some time in memory cells, the data may become obsolete, may be copied to another location, or for some other reason it may be desirable to erase the memory cells. In many non-volatile memory designs, erase is performed on a block-by-block basis. A subset of memory cells within a block may not be separately erased in such a design (block-erasable memory) so that a block may be considered the minimum unit of erase.

Figure 9:
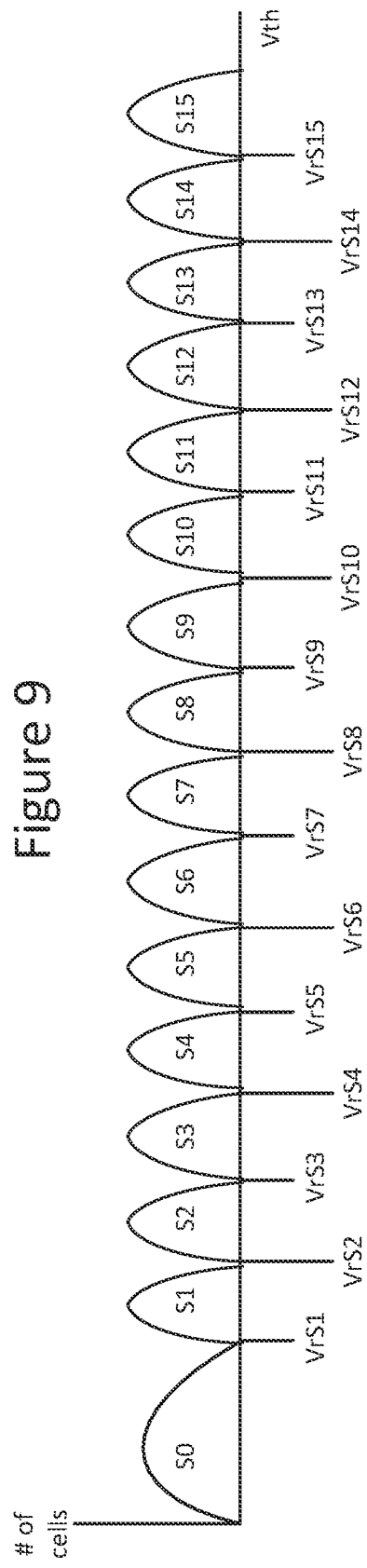
FIG. 9 shows another example of memory cell threshold voltages of a plurality of memory cells programmed to different data states to store data.

FIG. 9 shows another example Vth distribution of memory cells after a program operation in a set of memory cells with sixteen data states, or four bits per cell (QLC memory). The vertical axis depicts a number of memory cells, on a logarithmic scale, and the horizontal axis depicts a Vth of the memory cells on a linear scale. In one approach, at a start of the program operation, the memory cells are all initially in the erased distribution S0. Read voltages VrS1 to VrS15 are illustrated for corresponding distributions S1 to S15 (corresponding verify voltages are not shown in FIG. 9 for clarity).

In the examples of FIGS. 8-9, programming may be performed in a single continuous operation starting with all memory cells in the erased distribution (Er or S0) and ending with all or substantially all memory cells verified as being in their target distributions according to data to be stored. In other examples, programming to the states illustrated in FIGS. 8-9 may occur in two or more separate programming operations that may be performed at different times. Other operations may be performed between such programming operations.

In some cases, programming of one or more memory cells may affect threshold voltage distributions of previously programmed memory cells. For example, programmed memory cells along a word line of a NAND structure may be affected by programming of subsequent word lines of the NAND structure (e.g., programming of memory cells along an adjacent word line in the same block). When charge is added to nearby memory cells, the threshold voltages of previously programmed memory cells may increase so that threshold voltage distributions change in what may be referred to as "program disturb." This may cause misreading of data. In order to reduce such program disturb effects, programming may be performed in two or more operations to allow programming of adjacent memory cells before programming is finalized. For example, a first programming operation may program a group of memory cells to first distributions that are close to the final distributions in what may be referred to as a foggy programming operation. Then, memory cells of one or more neighboring word line may be programmed. Subsequently, after the neighboring cells are programmed, another program operation (fine programming operation) may program the group of memory cells to second distributions (e.g., final distributions like those shown in FIGS. 8-9). Programming to first (approximate or foggy) distributions and subsequently programming to second (accurate or fine) distributions in this way may be referred to as foggy-fine programming.

Figure 10:
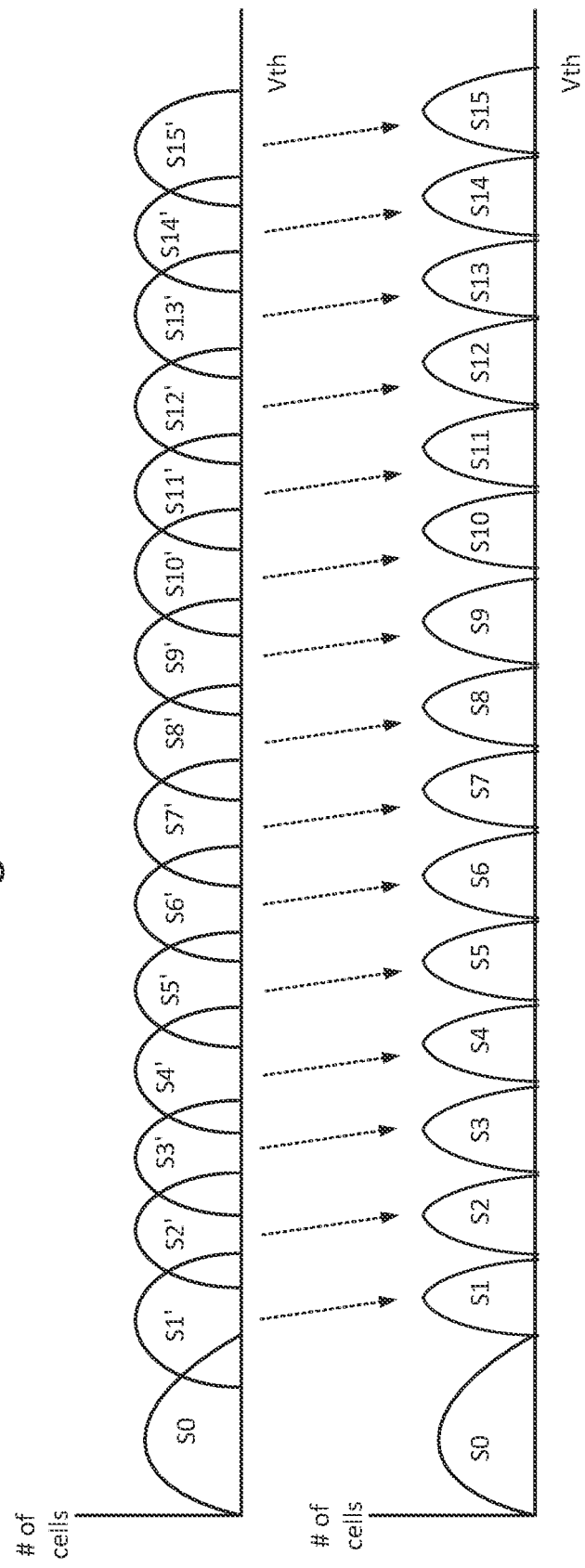
FIG. 10 illustrates an example of foggy programming followed by fine programming.

FIG. 10 illustrates an example of foggy-fine programming of a group of QLC memory cells using sixteen distributions corresponding to sixteen data states. All memory cells may be in an erased distribution (e.g., distribution S0) prior to foggy programming. Foggy programming programs memory cells to the first distributions S1' to S15' shown on the top of FIG. 10. Fine programming subsequently programs the memory cells to the second distributions S1 to S15 shown on the bottom. There may be some time between these two program operations and one or more other groups of memory cells may be programmed during that time. It will be understood that memory cells of a given first distribution are subsequently further programmed to a corresponding second distribution without erasing memory cells between so that fine programming does not start from the erased distribution. For example, memory cells that are programmed to the S1' distribution in a foggy program operation are subsequently further programmed to the S1 distribution in a fine program operation, memory cells that are programmed to the S2' distribution in a foggy program operation are subsequently further programmed to the S2 distribution in a fine program operation, memory cells that are programmed to the S3' distribution in a foggy program operation are subsequently further programmed to the S3 distribution in a fine program operation, and so on.

First distributions S1' to S15' are generally wider than second distributions S1-S15 and there is significant overlap between adjacent distributions (e.g., distribution S1' overlaps distribution S2', distribution S2' overlaps distribution S3' and so on). Programming to first distributions may use the same programming steps as used for second distributions or may use different steps (e.g., programming pulses of the same voltage and time or different voltage and/or time). Reading memory cells that are in the first distributions S1' to S15' using read voltages as shown in FIG. 9 may provide a large number of errors (e.g., more errors that can be corrected by ECC) because of such overlaps so that another source may be used for fine programming. A safe copy of the data may be maintained in another location between foggy program and fine program operations so that a good copy is available for fine programming. For example, a copy of the data may be written in additional non-volatile memory cells (e.g., in SLC memory cells, which may be in the same memory structure as the QLC memory cells, or elsewhere) or in a volatile memory for subsequent fine programming.

Figure 11:
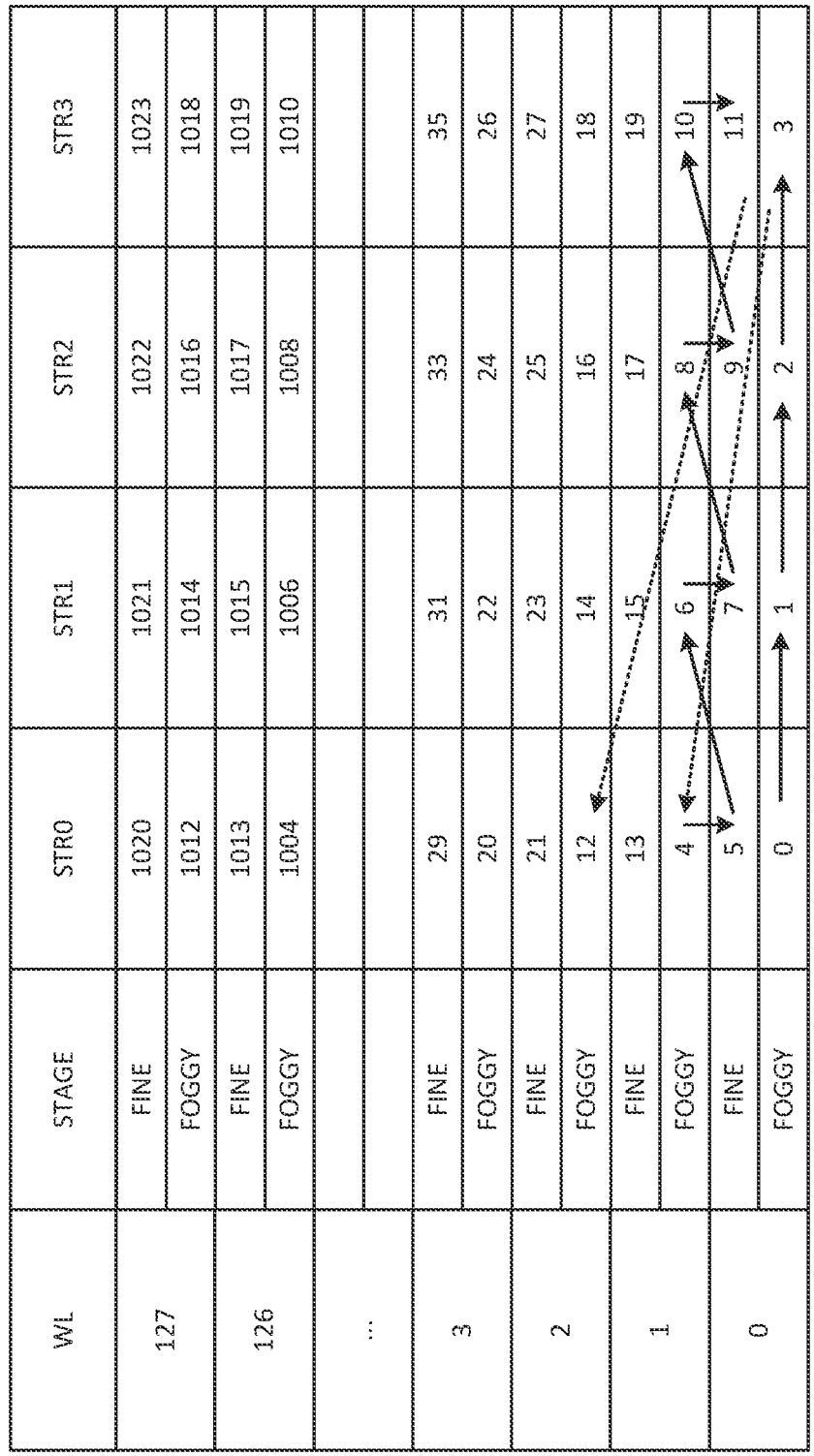
FIG. 11 illustrates an example of a scheme for foggy-fine programming of word lines in a NAND structure.

Between foggy programming and fine programming of a given word line, one or more other word lines (e.g., nearby word lines that may have some coupling with the given word line) may be programmed. FIG. 11 shows an example of a programming scheme that may be used to program word lines of four strings of a 3D NAND structure (e.g., NAND strings such as NS1 and NS2 illustrated in FIG. 6A). The first column on the left indicates that word line (WL) and the next column (STAGE) indicates the programming stage as either FOGGY or FINE for each of the four strings STR0 to STR3. Numbers at each entry indicate the order of foggy and fine programming of different strings and word lines. Arrows are used to indicate order of some steps.

Programming starts with foggy programming of WL 0 of STR0, STR1, STR2 and STR3, followed by foggy programming of WL 1, STR0, and then fine programming of WL 0, STR0. This is followed by foggy programming WL1, STR1, then fine programming WL0, STR1, foggy programming WL1, STR2, fine programming WL0, STR2, foggy programming WL1, STR3, fine programming WL0, STR3, followed by foggy programming of WL2, STR0, and so on. It can be seen that between foggy programming and fine programming of a given group of memory cells, other memory cells are programmed (e.g., foggy programmed) so that fine programming occurs after coupling effects of neighboring cells are already in place and thus program disturb effects are reduced. For example, while foggy programming of WL1, STR0 is the fourth program operation in FIG. 11, fine programming of WL1, STR0 is the thirteenth program operation so that nine other program operations occur in between. A copy of data that is foggy programmed and has not yet been fine programmed may be saved in a safe location until fine programming is complete (e.g., a safe copy of data for WL1, STR0 may be maintained between the fourth and thirteenth operations of FIG. 11). Maintaining a safe copy may take significant resources both in terms of storage space (e.g., in volatile or non-volatile memory) and in terms of bus usage to transfer the data.

In an example of the present technology, parity data may be calculated for data to be stored in MLC memory cells and this parity data may allow data that has been foggy programmed to be recovered (e.g., recovered by combining the results of reading foggy data with the parity data to obtain the original data without requiring a safe copy).

FIG. 12 illustrates an example of a gray code memory state encoding scheme used with parity data to facilitate recovery of data from memory cells that are foggy programmed. The encoding scheme illustrated may be applied to distributions shown in any of FIGS. 8-10. Distributions S0 to S15 (column 1) are each assigned a different four-bit digital value (column 2), or memory state, according to a gray code assignment scheme so that digital values assigned to any adjacent distributions differ by only one bit. For example, the digital values assigned to distribution S4 (1100) and neighboring distribution S3 (1101) have the first three bits the same (110) and only differ in the last bit. Similarly, the digital values assigned to distribution S4 (1100) and neighboring distribution S5 (0100) have the last three bits the same (100) and only differ in the first bit. Parity data (column 3) consists of one parity bit for each assigned digital value, which in this case is simply obtained by an Exclusive OR (XOR) operation on the bits of the digital value. Because a gray code is used for assignment of memory states, parity bits alternate 0-1-0-1 as shown. In other examples, other parity schemes (or different encoding schemes) may be used. While the digital values are shown mapped to distributions S0-S15, which may be achieved after fine programming, it will be understood that the same digital values are similarly mapped to first distributions S0-S15', which may result from foggy programming. Thus, for example, both S3 and S3' distributions are mapped to digital value 1101, both S12 and S12' distributions are mapped to digital value 1010, etc. Use of a gray code assignment scheme with parity data may facilitate recovery of data from memory cells that are foggy programmed (e.g., memory cells that have not yet been fine programmed and are in data states S1'-S15', not in states S1-S15).

Figure 13A:
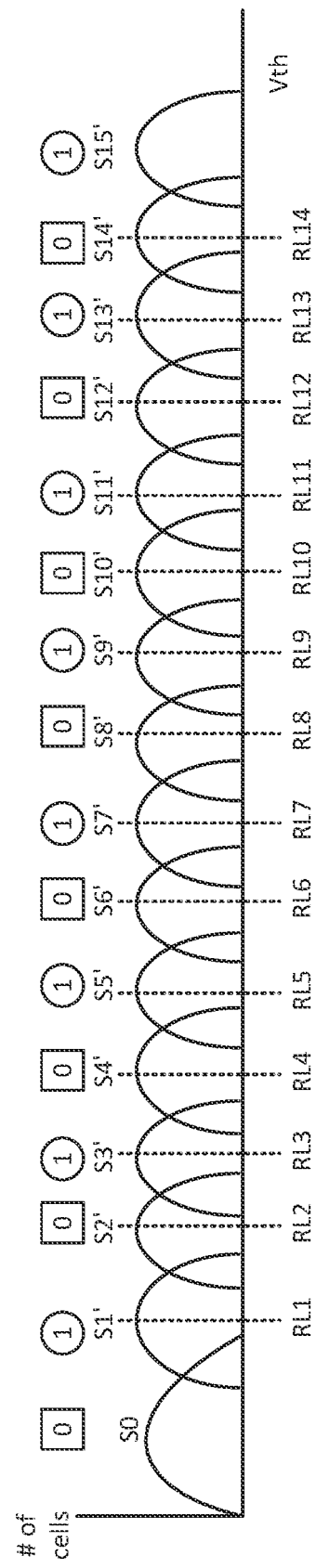
FIG. 13A illustrates an example of a foggy read of memory cells that have been foggy-programmed.

FIG. 13A illustrates an example of how a suitable gray code assignment with parity data (e.g., as illustrated in FIG. 12 or using a different gray code) may be used to facilitate accurate recovery of data from memory cells that are foggy programmed. FIG. 13A shows distributions S1'-S15' (in addition to erased distribution S0), with one-bit parity data indicated above each distribution (either a 1 or 0 value). This corresponds to memory cells that are in a foggy programmed condition (e.g., while neighboring memory cells are being programmed) with parity data generated e.g., as shown in FIG. 12. A series of read steps may be performed at read levels RL1 to RL14 as illustrated in FIG. 13A. Read levels RL1 to RL14 are not located between distributions as in previous examples (e.g., not like VrA-VrG of FIG. 8 or VrS1-VrS15 of FIG. 9). Instead, each read level RL1 to RL14 is located at or near the middle (midpoint) of a distribution, or about halfway between distributions on either side. For example, RL3 is about halfway between distribution S2' and distribution S4', which is in the middle of distribution S3'. Thus, RL3 is between two distributions (S2' and S4') with even parity values (parity value=0) at or near the middle of a distribution (S3') with an odd parity value (parity value=1). Read levels RL1 to RL14 are located at or near the middle of distributions S1 to S14 (i.e., at or near the middle of all distributions except the lowest distribution, S0, and highest distribution, S15).

Reading foggy-programmed data states S1' to S15' at the fourteen read levels RL1-RL14 in combination with parity values shown (which alternate according to the gray code used) may be sufficient to accurately recover data programmed in a foggy programming operation. In some cases, this may allow data that is foggy programmed to be directly recovered from foggy programmed memory cells so that a safe copy does not have to be maintained elsewhere (e.g., may not require a safe copy in SLC or in volatile memory).

Memory cells that turn on (become conductive or undergo a tripping event, e.g., as detected by a sense block) when RL1 is used (e.g., when a voltage at RL1 is applied to a corresponding word line) may be in either the S0 or S1' distributions. Which of these distribution a given cell is in may be determined from the parity bit associated with the cell (e.g., any cell that turns on with RL1 and has parity=0 is in distribution S0, while any cell that turns on with RL1 and has parity=1 is in distribution S1'). In this way, all memory cells in the S0 distribution (and some memory cells in the S1' distribution) may be found from a read at RL1. Memory cells that do not turn on with RL1 and turn on with RL2 (tripping event detected between RL1 and RL2) may be in either S1' or S2' distributions. Which of these distribution a given cell is in may be determined from the parity bit associated with the cell (e.g., any cell that first turns on with RL2 and has parity=1 is in distribution S1', while any cell that first turns on with RL2 and has parity=0 is in distribution S2'). In this way, remaining memory cells in the S1' distribution (and some memory cells in the S2' distribution) may be found from a read at RL2. Memory cells that do not turn on with RL1 or RL2 and turn on with RL3 may be in either S2' or S3' distributions. Which of these distribution a given cell is in may be determined from the parity bit associated with the cell (e.g., any cell that first turns on with RL3 and has parity=0 is in distribution S2', while any cell that first turns on with RL3 and has parity=1 is in distribution S3'). In this way, remaining memory cells in the S2' distribution (and some memory cells in the S3' distribution) may be found from a read at RL3. This approach may extend through RL14 to identify all cells in S0 and S1'-S13' and some cells in S14'. Memory cells that do not turn on (do not experience a tripping event) when RL14 is applied are either in distribution S14' or S15' and these may be distinguished by respective parity bits (memory cells that do not turn on with RL14 and have parity=0 are in distribution S14' while memory cells that do not turn on with RL14 and have parity=1 are in distribution S15').

FIGS. 13B-D illustrates implementations of reading QLC cells that have been foggy programmed as illustrated in FIG. 13A (e.g., memory cells in a NAND structure as illustrated in FIGS. 6A-C or other memory structure). FIG. 13B illustrates an assignment scheme that assigns digital values to sixteen distributions S0-S15 using a gray code to ensure that adjacent distributions differ by only one bit. Distributions S0-S15 are listed in the first column with digital values (or memory states) listed in the second column and parity values corresponding to each digital value listed in the third column. Parity values may be obtained by XORing the four bits of the corresponding digital value. The scheme illustrated in FIG. 13B may be an alternative to the scheme illustrated in FIG. 12 (other encoding schemes, including different parity schemes, may also be used). Encoding data using the parity values shown in FIG. 13B may allow subsequent recovery of data that is foggy programmed.

FIG. 13C illustrates how reading memory cells at read levels RL1-RL14 as illustrated in FIG. 13A may be combined with parity bits to recover data that has been foggy programmed. Read levels are listed in the first column with initial values (four-bit digital values) listed in the second column. For each cell with an initial value in the second column, the recovered value (decoded value) depends on the parity bit for the cell. Parity bits are listed in the third column and corresponding recovered values are listed in the fourth column. Decoding foggy-read data (e.g., initial values) using parity values to obtain recovered values may make maintaining a safe copy of foggy-programmed data unnecessary in some cases.

Memory cells that turn on at RL1 may be assigned an initial value 1111 (corresponding to distribution S0 in the table of FIG. 13B). If the corresponding parity bit=0 then the recovered value is also 1111 (e.g., memory cell is in distribution S0) and if the parity bit=1 then the recovered value is 1110 (e.g., memory cell is in distribution S1' and the fourth bit is flipped). Memory cells that do not turn on at RL1 and turn on at RL2 may be assigned an initial value 1110 (corresponding to distribution S1 or S1' in the table of FIG. 13B). If the corresponding parity bit=1 then the recovered value is also 1110 (e.g., memory cell is in distribution S1' and the initial value is used as the recovered value) and if the parity bit=0 then the recovered value is 1010 (e.g., memory cell is in distribution S2' and the second bit is flipped). Memory cells that do not turn on at RL1 or RL2 and turn on at RL3 may be assigned an initial value 1010 (corresponding to distribution S2 or S2' in the table of FIG. 3B). If the corresponding parity bit=0 then the recovered value is also 1010 (e.g., memory cell is in distribution S2' and the initial value is used as the recovered value) and if the parity bit=1 then the recovered value is 1000 (e.g., memory cell is in distribution S3' and the third bit is flipped). This approach continues as shown in FIG. 13C until RL14, where memory cells that first turn on at RL14 are assigned an initial value of 0111 (corresponding to distribution S13 or S13' in the table of FIG. 13B) and, depending on the corresponding parity values, are assigned recovered values of either 0111 (if parity=1) or 0011 (if parity=0). Remaining memory cells that do not turn on at RL14 (indicated by "Remaining" in FIG. 13C) are assigned an initial value of 0011 (corresponding to distribution S14 or S14') and, depending on the corresponding parity values, are assigned recovered values of either 0011 (if parity=0), corresponding to distribution S14, or 1011 (if parity=1), corresponding to distribution S15.

Foggy reading with parity data to recover values may be implemented in various ways. FIG. 13D illustrates an example that applies logic operations to the initial value (bits T, C, B, and A) and parity bit (S) to flip a bit when indicated by the corresponding logic operation. For example, in the first line, the initial value 1111 may occur with parity bit 0 or 1. If the parity bit is 1 (T&C&B&A&S), then bit A is flipped to 0 (A=0) and otherwise the initial value 1111 is used as the recovered value. In the second line, the initial value 1110 may occur with parity bit 0 or 1. If the parity bit is 0 (T&C&B&!A&!S, where "!" indicates the inverse so !A is the inverse of A, i.e., if A=0, !A=1 and if A=1, !A=0), then bit C is flipped to a 0 (C=0) and otherwise the initial value 1110 is used as the recovered value. In the third line, the initial value 1010 may occur with parity bit 0 or 1. If the parity bit is 1 (T&!C&B&!A&S), then bit B is flipped to a 0 (B=0) and otherwise the initial value 1010 is used as the recovered value. It can be seen that for the sixteen values illustrated for a QLC memory, fifteen logic operations may be sufficient to obtain the recovered values. Because a gray code is used, for any given initial value, there is only one bit to flip depending on the parity bit. The bits to be flipped are shaded for illustration.

Simple logic operations such as AND operations may be implemented on a memory die. In some cases, such logic operations may be applied while data is held in data latches such as data latches 494-497 (e.g., with additional latches for parity data). Bits may be flipped according to the scheme while data remains in latches (e.g., prior to being used to write the recovered values in a fine write operation). Reading foggy programmed data as illustrated in FIG. 13A may result in initial values being latched in data latches 494-497. When this data is combined with parity values (e.g., using logic operations illustrated in FIG. 13D) the recovered values may be obtained by flipping bits while the data remains in data latches 494-494. This recovered data may then be written back from data latches 494-497 to the same memory cells in a fine write operation so that transfer of initial values and recovered values to other circuits (e.g., outside a memory die) is unnecessary.

Figure 13E:
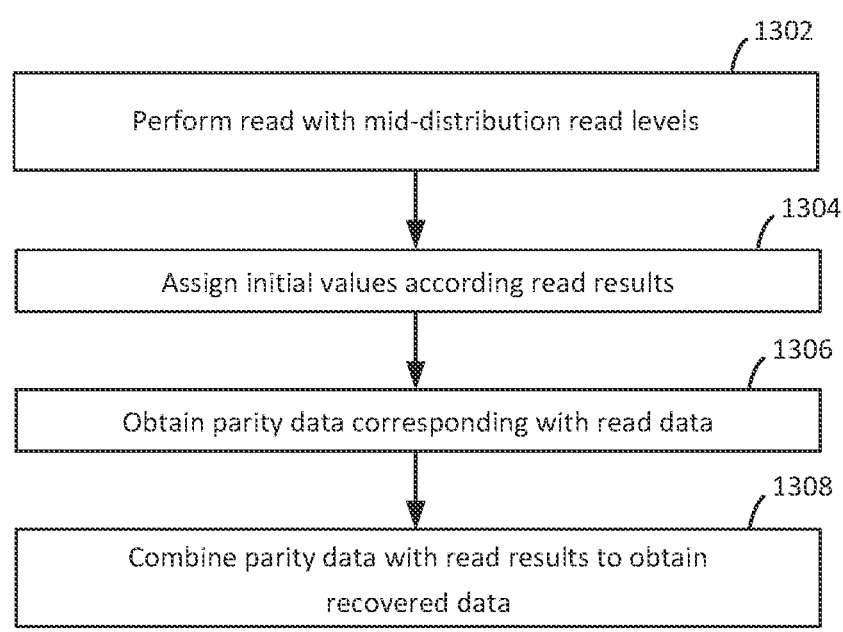
FIG. 13E illustrates an example of a method of performing a foggy read.

FIG. 13E illustrates an operation to recover data from memory cells that are foggy programmed by using parity data (e.g., as in the example of FIGS. 13A-D above). The method includes performing a read with mid-distribution read levels at step 1302 (e.g., RL1-RL14 as illustrated in FIG. 13A), assigning initial values according to read results at step 1304 (e.g., initial values corresponding to RL1-RL14 as illustrated in FIG. 13C), obtaining parity data corresponding with read data step 1306 (parity data may be generated prior to foggy programming and may be saved for subsequent use), and combining parity data with read results to obtain recovered data step 1308 (e.g., by flipping a bit of an initial value when indicated by a parity bit as illustrated in FIGS. 13C-D).

Recovery of data from foggy programmed memory cells (decoding) as illustrated in FIGS. 13A-D uses parity data in combination with results of a foggy read operation. Parity data may be calculated when the data is written, or before it is written, and may be stored in an appropriate location. For example, parity data may be calculated in a memory controller before it is sent to a memory die and may be stored in a volatile memory (e.g., DRAM) until it is needed to recover foggy programmed data.

Figure 14:
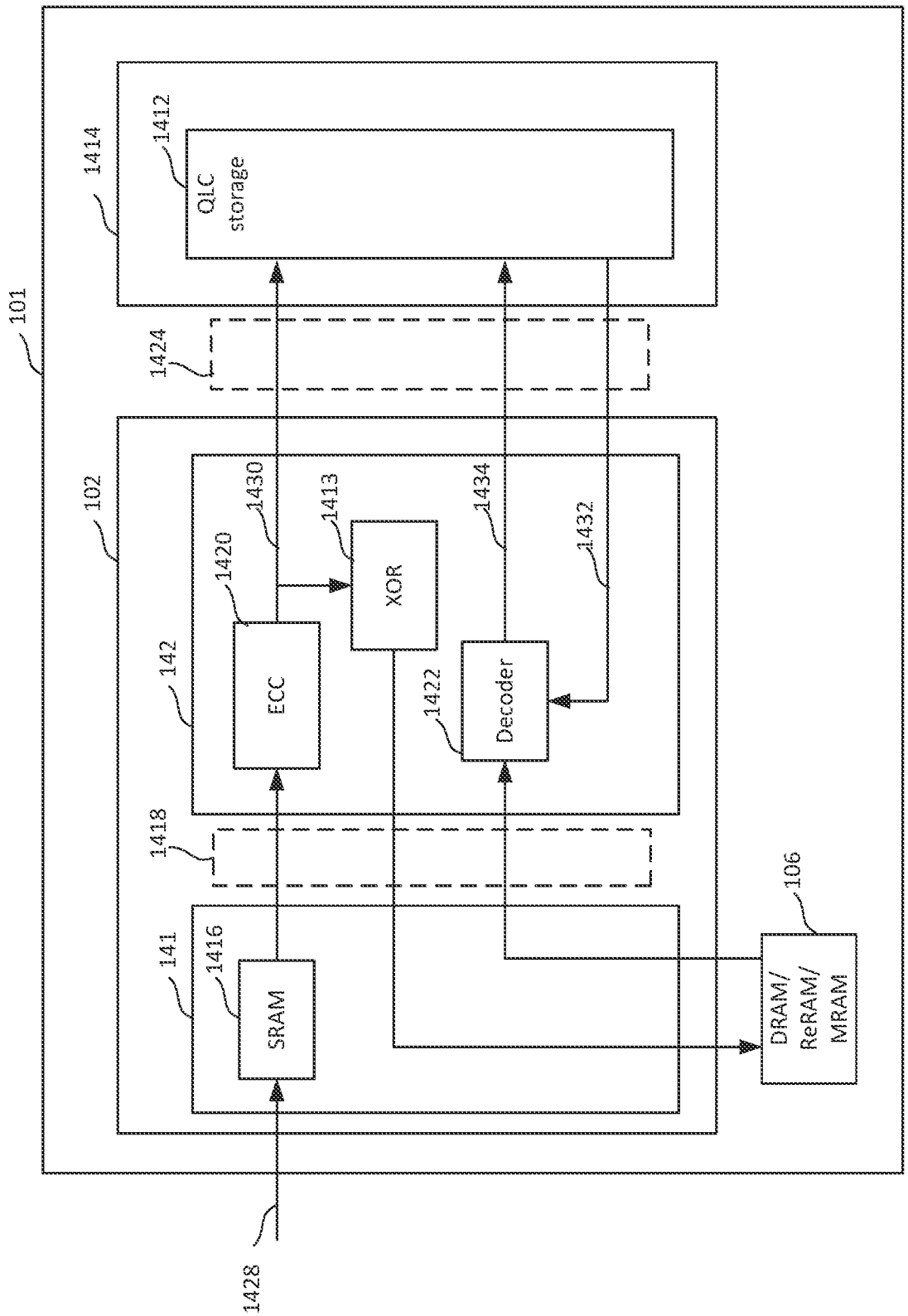
FIG. 14 illustrates an example of a memory device using foggy-fine programming with off-chip encoding.

FIG. 14 illustrates an example in which memory device 101 (e.g., as shown in FIG. 1A) is modified to implement encoding and decoding of data from memory cells that are foggy programmed in QLC storage 1412 in a non-volatile memory die 1414 (e.g., an individual non-volatile memory die of non-volatile memory 104). Controller 102 includes FEP circuit 141 and BEP circuit 142 including SRAM 1416. FEP circuit 141 is connected to BEP circuit 142 via a bus 1418 (e.g., PCIe interface). BEP circuit 142 includes an ECC circuit 1420 (e.g., ECC engine 226/256), which may implement Low Density Parity Check (LDPC) encoding and decoding), a parity circuit, which in this case is an XOR circuit 1413 (e.g., XOR circuit 1413 may be implemented by XOR engine 224/254) and a decoder circuit 1422 (e.g., implemented using a processor 220/250). Controller 102 is connected to non-volatile memory die 1414 through bus 1424 (e.g., memory bus 294).

Data is received from a host at input 1428 and is transferred from SRAM 1416, through bus 1418 to ECC circuit 1420 which encodes the data and transfers it 1430, through bus 1424 for foggy programming in QLC storage 1412 and also sends it to XOR circuit 1413, which calculates XOR bits that are saved in local memory (DRAM/ReRAM/MRAM 106 in this example). Subsequently, other writes may occur while the data remains foggy programmed and at some later point in a programming sequence (e.g., sequence illustrated in FIG. 11) the data may be fine programmed. At the time of fine programming, a foggy read (e.g., as illustrated in FIGS. 13A-D) may be performed and the results transferred 1434 to decoder 1422 (e.g., initial values illustrated in FIG. 13C may sent from read/write circuits of non-volatile memory die 1414 to decoder 1422). Decoder 1422 also receives XOR bits from local memory 106 and combines the foggy read results with the XOR bits to obtain recovered data (e.g., as illustrated in FIG. 13C). These results are then transferred 1434 and written in the same memory cells in a fine program operation (e.g., same memory cells that were foggy programmed are further programmed).

It can be seen that this example includes transfer of significant data between components (e.g., between controller 102 and memory die 1414 over bus 1424 and between FEP circuit 141 and BEP circuit 142 over bus 1418). For example, in QLC storage, four logical pages of data may be stored together and the result of XORing four such pages is a page of parity data. In the scheme illustrated in FIG. 14, programming such data includes transfer 1430 of the four logical pages of data, subsequent transfer 1432 (through bus 1424) of four pages obtained from a foggy read to controller 102, and transfer 1434 of four pages of recovered data back to memory die 1414 for fine programming. This may result in significant traffic on bus 1424 especially where the bus is shared between multiple memory dies (e.g., as illustrated in FIG. 1D). Furthermore, significant space may be occupied in local memory 106 by XOR data (e.g., one logical page of XOR data for every four logical pages of data that are foggy programmed). Accessing XOR data in local memory 106 may produce significant traffic on bus 1418.

Figure 15A:
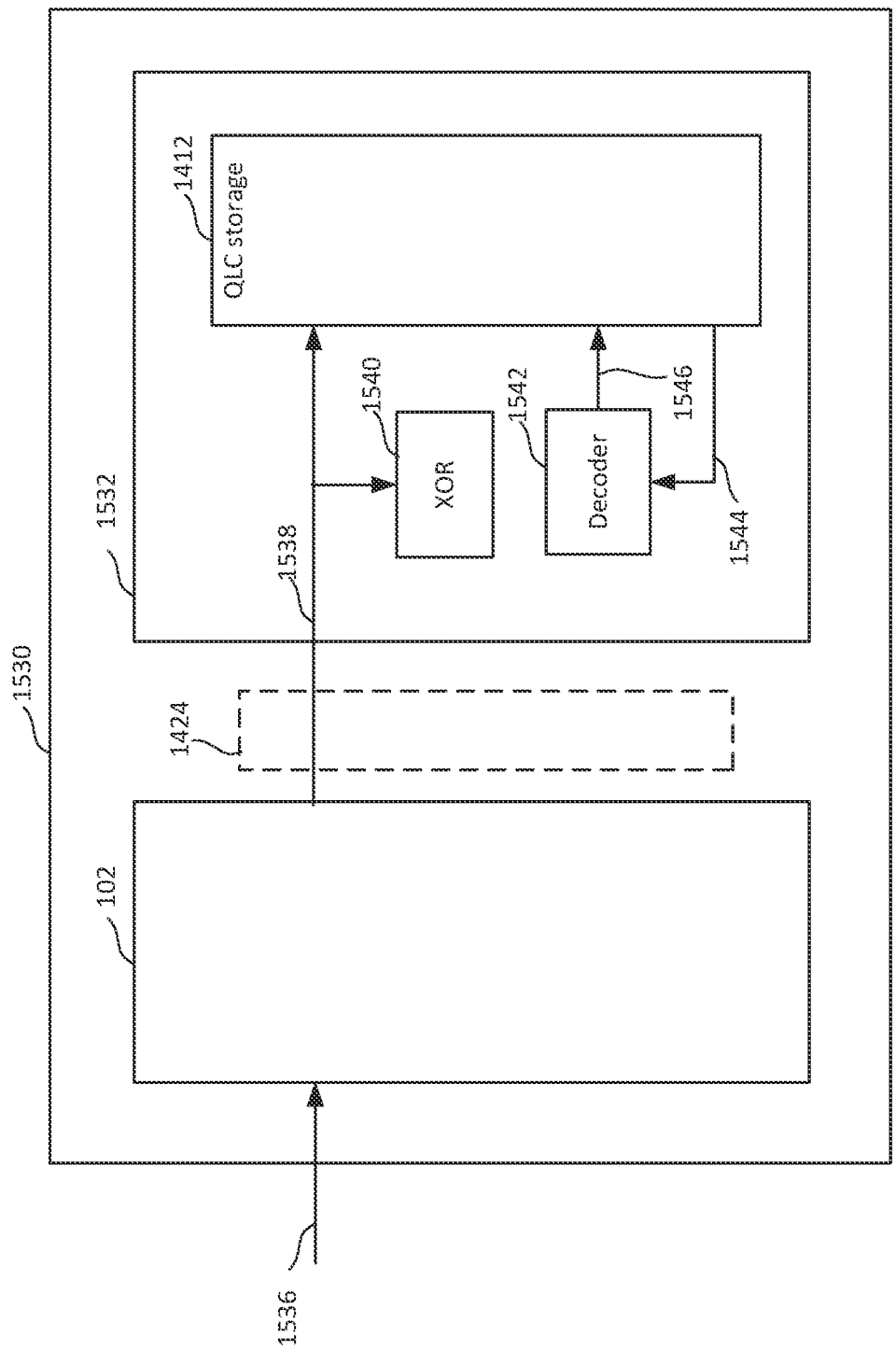
FIG. 15A illustrates an example of a memory device using foggy-fine programming with on-chip encoding.

FIG. 15A shows an example of a memory device 1530, which is configured to perform on-chip encoding and decoding for foggy-fine programming. Memory die 1532 includes parity data generating circuits, XOR circuits 1540 in this example, which are configured to generate parity data (XOR data) in memory die 1532. XOR circuits 1540 may be considered as means for calculating parity data for data to be stored in non-volatile memory cells of QLC storage 1412. For example, when data is transferred 1536 to memory device 1530, the data may be transferred 1538 (along with any ECC data) from controller 102, through bus 1424 to QLC storage 1412 and also to XOR circuit 1540 of memory die 1532. The data may be foggy programmed in QLC storage 1412 and may also be used to generate parity data (XOR data in this example). The parity data may be saved while the data is foggy programmed until fine programming is initiated. Memory die 1532 also includes on-chip decoder 1542, which is configured to receive foggy read data from QLC storage 1412 (transfer 1544) and to decode the foggy read data using XOR data previously generated by XOR circuit 1540. The decoded data that is recovered in this way is transferred 1546 to QLC storage 1412 in a fine programming operation. Generating parity data on-chip and performing decoding on-chip in this way may allow foggy-fine programming to be performed without a safe copy of data (e.g., using the combination of foggy programmed data and parity data instead of a safe copy) and with relatively little traffic on bus 1424. For example, when four logical pages of data are to be written, the four logical pages are transferred 1538 to memory die 1532. Subsequently, four logical pages of foggy read data are transferred to on-chip decoder 1542, which does not generate traffic on bus 1424, and recovered data is transferred 1546 back to QLC storage 1412 also without generating traffic on bus 1424. In some cases, XOR data may be saved in SLC storage in memory die 1532 so that parity data may be saved and recovered without generating traffic on bus 1424 (in other examples, XOR data from XOR circuit 1540 may be saved off-chip, e.g., in memory controller 102 or in a volatile memory connected to memory controller 102).

Figure 15B:
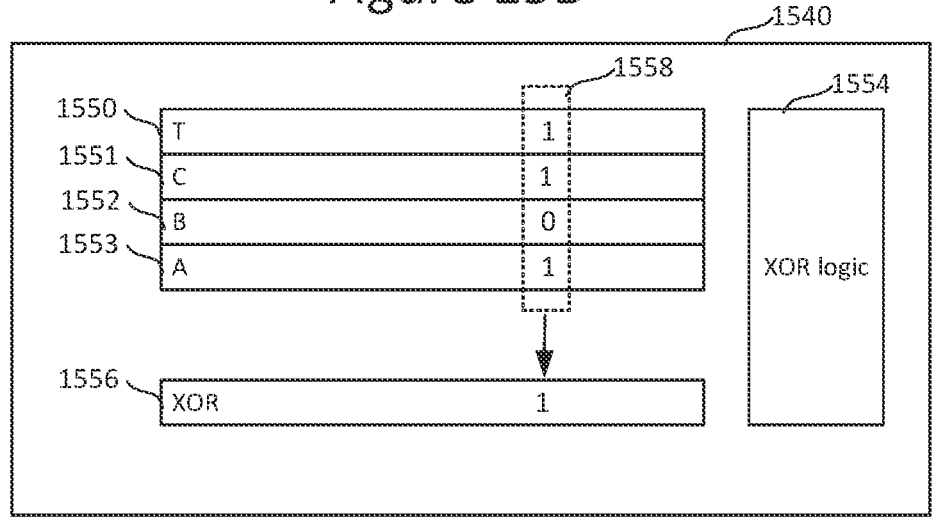
FIG. 15B illustrates an example of generation of parity data (encoding) for foggy-programming.

FIG. 15B illustrates an example implementation of on-chip XOR circuits 1540, which includes four sets of data latches 1550-1553 corresponding to four logical pages of data to be programmed in a physical page of QLC storage 1412 (logical pages labeled "T", "C", "B", and "A" respectively). For example, each set of latches may have capacity for one logical page of data from a host along with ECC data (e.g., calculated by ECC circuits of memory controller 102) and any other overhead data that may be stored with data from a host. XOR circuits 1540 includes XOR logic circuit 1554, which is configured to perform an XOR logic operation on each set of bits corresponding to a memory cell of QLC storage 1412 and generate a corresponding bit of XOR data (parity data). XOR logic circuit 1554 may be considered an example of means for calculating parity data for data to be stored in the plurality of non-volatile memory cells. Parity data is stored in a set of data latches 1556. An example set of bits 1558 are to be programmed to a memory cell of QLC storage 1412. XOR logic circuit 1554 calculates a corresponding parity bit (in this case "1") corresponding to bits 1101 of set of bits 1558. For example, modulo 2 addition or other techniques may be used to generate XOR bits (e.g., where there is an odd number of "1" bits, the XOR result is "1"). Where parity bits are generated in other ways (not XOR), different logic may be applied to generate parity bits. Data latches 1550-1553 may be implemented by data latches 494-497 of FIG. 3A and encoding (calculation of XOR bits in this example) may be performed when data is in latches before or during foggy programming. Data latches 1550-
1553 (e.g., data latches 494-497) in combination with additional circuits of sense block 350, may be considered an example of a means for programming the plurality of non-volatile memory cells to first distributions.

Figure 15C:
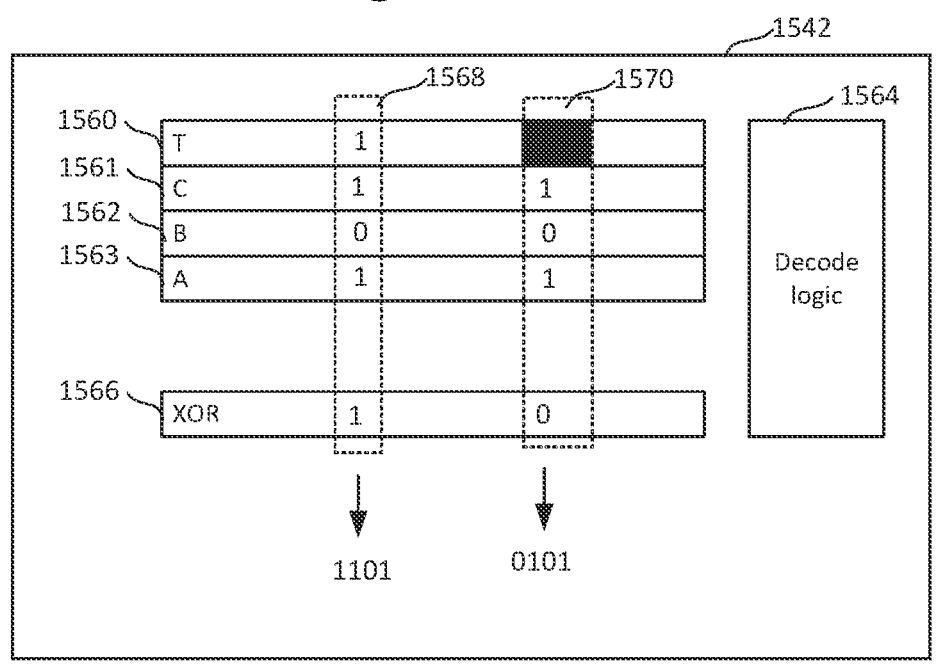
FIG. 15C illustrates an example of recovery of data using initial values from foggy-read in combination with parity data (decoding).

FIG. 15C shows an example of on-chip decoder 1542, which includes four sets of data latches 1560-1563 corresponding to four logical pages of data obtained from a foggy read of a page of QLC storage 1412. For example, each set of latches may have capacity for one logical page of data along with ECC data and any other overhead data that may be stored with data received from a host. In some examples, the same physical data latches may be used as XOR data latches 1550-1553 and for decode data latches 1560-1563 (e.g., data latches 494-497). When a foggy read is performed (e.g., as illustrated in FIG. 13A) initial data states may be loaded in data latches 1560-1563 (e.g., initial values listed in FIG. 13C). Data latches 1560-1563 (e.g., data latches 494-497) in combination with additional circuits of sense block 350, may be considered an example of a means for reading the plurality of non-volatile memory cells in the first distributions. On-chip decoder 1542 includes decode logic circuit 1564, which combines the initial values obtained from such a foggy read with parity data (e.g., XOR data generated by XOR circuits 1540 prior to foggy programming) in a set of data latches 1566. Decode logic circuit 1564 may combine foggy read data and parity data as illustrated in FIGS. 13C-D so that an initial value from a memory cell may be used as a recovered value, or one bit may be flipped, depending on the parity value associated with the memory cell. For example, decode logic circuit 1564 may include AND logic and NOR logic circuits to perform the logic operations illustrated in FIG. 13D. In a first example 1568, foggy reading of a memory cell provides an initial value 1101 (e.g., memory cell becomes conductive at RL12) and the corresponding XOR bit for the memory cell is 1. Decode logic circuit 1564 generates a recovered value of 1101 in this case (as shown in the corresponding entries of FIG. 13C-D). In a second example 1570, foggy reading of another memory cell provides an initial value 1101 and the corresponding XOR bit for the memory cell is 0. Decode logic circuit 1564 generates a recovered value of 0101 in this case (as shown in the corresponding entries of FIG. 13C-D). Decode logic circuit 1564 may simply flip bit T (shaded) to 0 according to the logic operation illustrated in FIG. 13D (If T&C&!B&A&!S then set T=0) so that the initial value is replaced with the recovered value while in latches 1560-1563. Decode logic circuit 1564 is configured to generate the recovered values of FIGS. 13C-D from corresponding initial values obtained by foggy reading of memory cells of QLC storage 1412 in combination with XOR bits. These recovered values may then be used to perform fine programming of memory cells (e.g., the same memory cells that were foggy programmed are further programmed as illustrated in FIG. 10 based on recovered values). Data may be fine programmed from data latches 1560-1563 (e.g., data latches 494-497). On-chip decode 1542 may be considered as an example of a means for recovering the data from results of reading the plurality of non-volatile memory cells in the first distributions combined with the parity data and further programming the plurality of non-volatile memory cells from the first distributions to second distributions to store the data.

Figure 16:
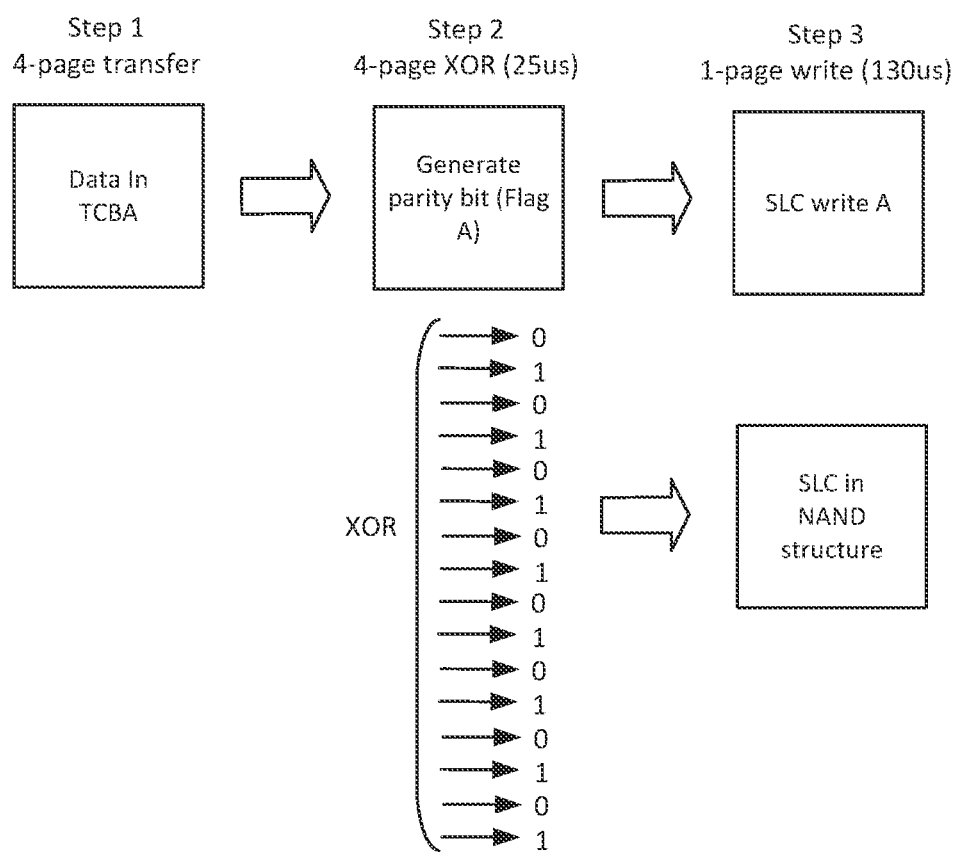
FIG. 16 illustrates an example of on-chip encoding using XOR.

FIG. 16 illustrates an example of a series of steps used in programming. In step 1, four logical pages of data are transferred to a memory die (e.g., memory die 1532) and are loaded in corresponding sets of data latches (e.g., latches T, C, B, A). In step 2, the four logical pages are subject to an XOR operation to generate an XOR bit (or flag "A") for each memory cell to be programmed. In the example of FIG. 16, this takes 25 µs. In step 3, the XOR bits (one logical page of XOR data generated from four logical pages of transferred data) are written in SLC memory (e.g., written in a portion of NAND memory on memory die 1532 that is designated as SLC). In the example of FIG. 16, this takes 130 µs. Thus, on-chip encoding (by XOR-ing) and storing of XOR data in SLC may be rapidly performed. It will be understood that SLC portions and QLC portions may be separate structures or may both be formed in a common structure (e.g., some blocks of a structure may be designated as QLC blocks and others as SLC blocks, and these designations may change over time).

Figure 17:
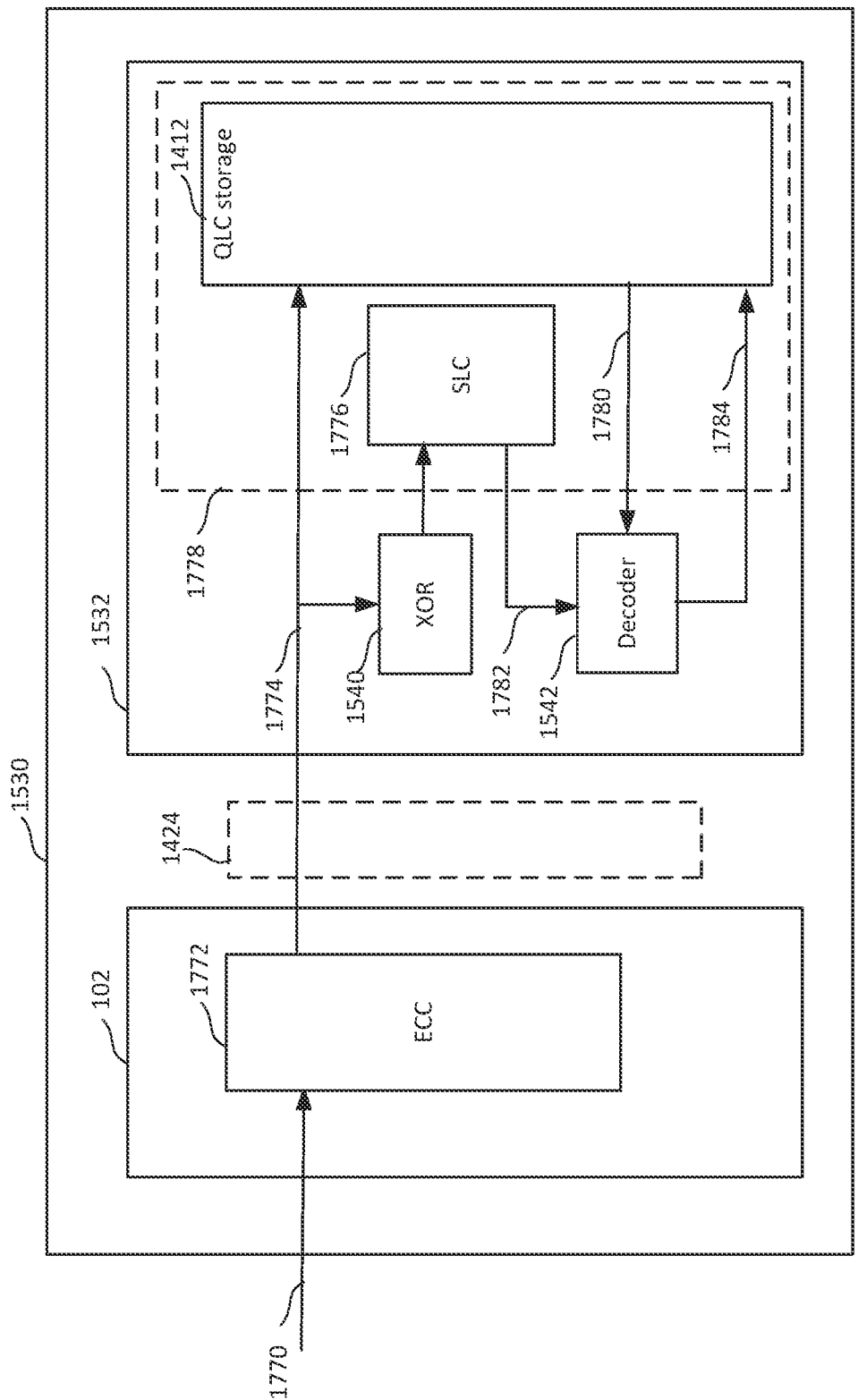
FIG. 17 illustrates an example implementation of foggy-fine programming with parity data stored on-chip in SLC memory cells.
Figure 18:
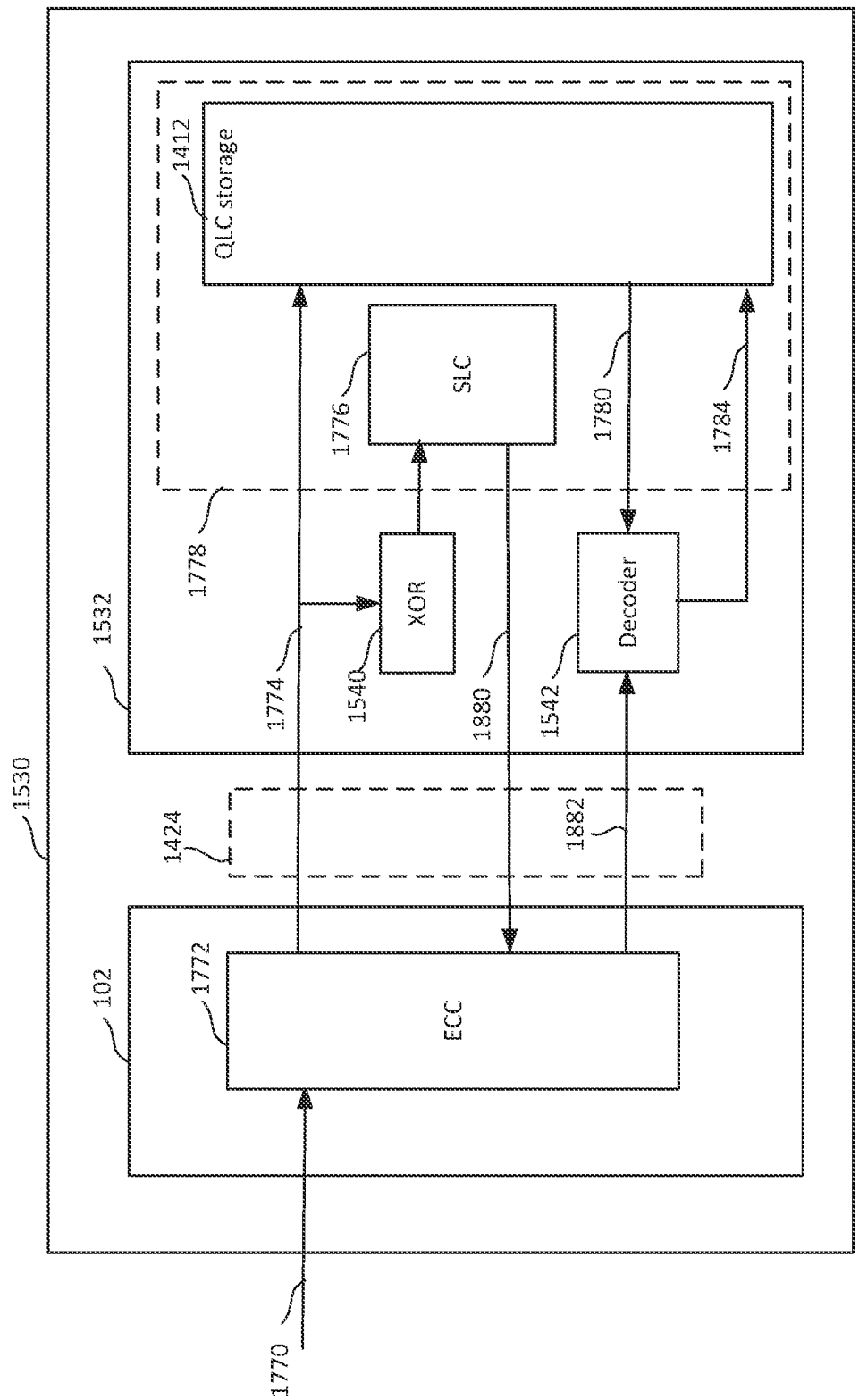
FIG. 18 illustrates an example implementation of foggy-fine programming with parity data corrected by ECC.
Figure 19:
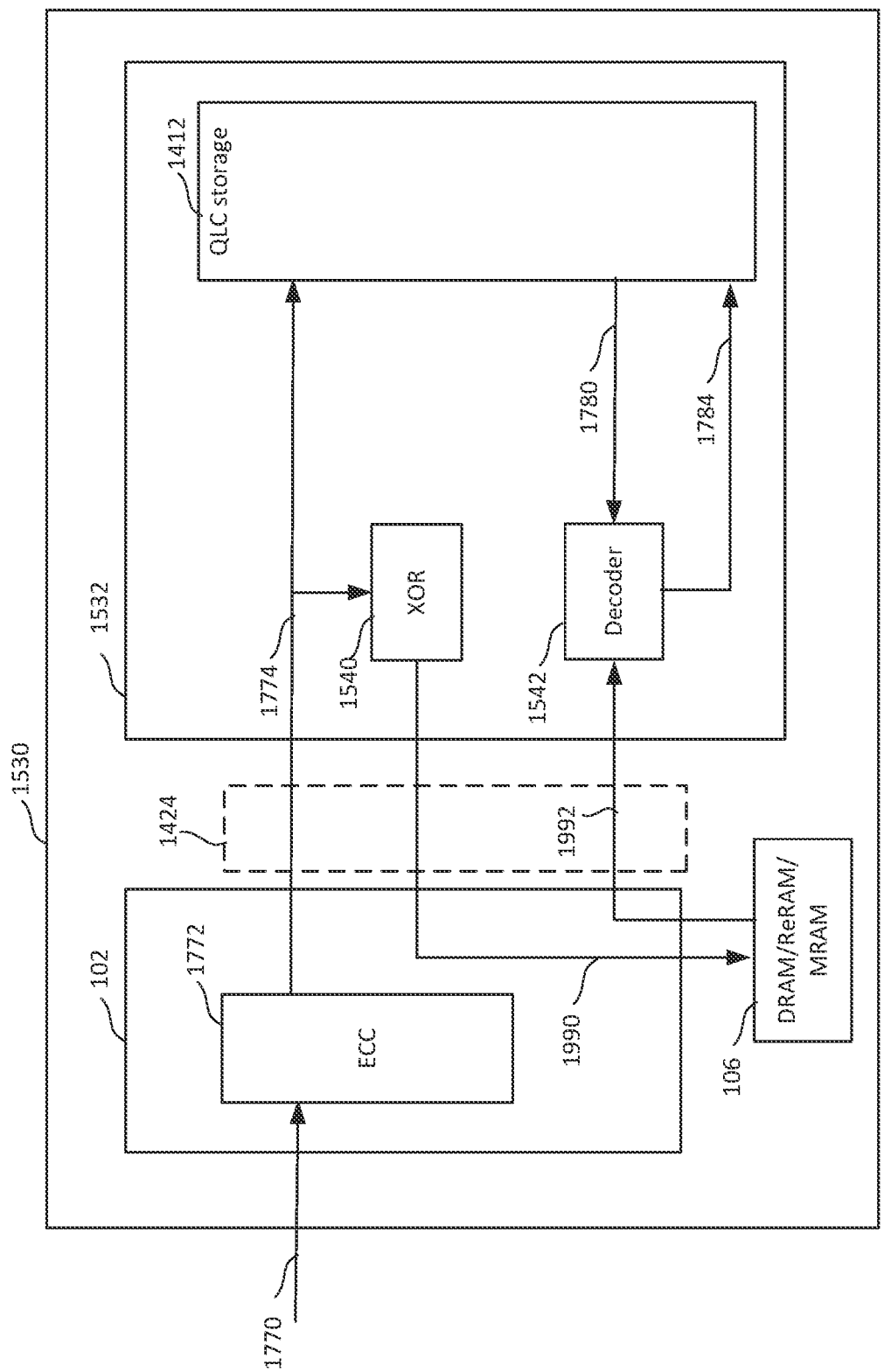
FIG. 19 illustrates an example implementation of foggy-fine programming with parity data stored off-chip in DRAM.

On-chip encoding and decoding for foggy-fine programming as described in any of the examples above may be implemented in various ways including, but limited to, the examples of FIGS. 17-19. FIG. 17 shows an example in which SLC memory cells are used to store parity data (e.g., XOR data) for later use in fine programming. A data transfer 1770 (e.g., from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then stored in SLC cache 1776. SLC cache 1776 is a portion of structure 1778 (e.g., 3-D NAND memory structure) that is configured for SLC data storage. Structure 1778 also includes QLC storage 1412 and these portions may be reconfigurable. After foggy programming, while the data is in QLC storage 1412 and corresponding XOR data is in SLC cache 1776, other data may be programmed (e.g., as illustrated in FIG. 11). Subsequently, fine programming may be scheduled, and a foggy read may be performed to read initial values from QLC storage 1412 to decoder 1542 (transfer 1780) and XOR data may be read from SLC cache 1776 (transfer 1782). Decoder 1542 then generates recovered values from the combination of foggy read data and XOR data (e.g., decoding as illustrated in FIG. 13C). These recovered values are then used to perform fine programming of the memory cells that were previously foggy programmed (transfer 1784). Thus, in this example, the only transfer of data across bus 1424 is when the initial data (e.g., four logical pages of user data and any overhead) is transferred to memory die 1532. Subsequent transfers of XOR data, foggy read data, and recovered data occur internally in memory die 1532.

FIG. 18 illustrates another example in which SLC memory cells are used to store parity data (XOR data) for later use in fine programming. A data transfer 1770 (e.g., from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then stored in SLC cache 1776. Subsequently, fine programming may be scheduled, and a foggy read may be performed to read initial values from QLC storage 1412 to decoder 1524 (transfer 1780). In this example, XOR data is not directly transferred from SLC cache 1776 to decoder 1542. XOR data from SLC cache 1776 is transferred to ECC circuit 1772 of memory controller 102, via bus 1424 (transfer 1880) where error correction is performed. Corrected XOR data (decoded parity data) is transferred, via bus 1424, to decoder 1542 (transfer 1882). ECC circuit 1772 may be considered an example of a means for Error Correction Code (ECC) decoding parity data and sending decoded parity data to decoder 1542. Decoder 1542 then generates recovered values from the combination of foggy read data and corrected XOR data (e.g., as illustrated in FIG. 13C). These recovered values are then used to perform fine programming of the memory cells that were previously foggy programmed (transfer 1784). Thus, in this example, in addition to the initial transfer 1774 (e.g., four logical pages) across bus 1424, there is also transfer of XOR data (e.g., one logical page for the four logical pages of data) from memory die 1532 to memory controller 102 and transfer of corrected XOR data back from memory controller 102 to memory die 1532 on bus 1424. Because errors in XOR data may result in errors in recovered data and therefore errors in fine programmed data, reduction or elimination of such errors using ECC may justify the additional traffic on bus 1424.

While parity data may be separately encoded by ECC circuit 1772 prior to storage in SLC cache 1776, in some cases no separate encoding is required where, for example, the parity data is an XOR product of encoded data (e.g., XOR product of codewords may provide a codeword so that separate encoding is not required). ECC correction of parity data may be applied to all data or may be selectively used. For example, ECC correction may be used for selected blocks (blocks with high errors), selected portions of a given block (e.g., lower levels of a 3-D block), or in response to a triggering event (e.g., after a certain number of write-erase cycles, a temperature above a threshold, or other such event). Thus, memory device 1530 may use both the scheme of FIG. 17 and the scheme of FIG. 18 at different times and/or for data in different portions of QLC storage 1412.

FIG. 19 illustrates an example in which local memory, local memory 106 (e.g., DRAM), is used to store parity data (XOR data) for later use in fine programming. A data transfer 1770 (e.g., from a host) is received by memory controller 102 and the data is ECC encoded by ECC circuit 1772. Encoded data is then transferred 1774, via bus 1424, to QLC storage 1412 where it is foggy programmed, and also transferred to XOR circuits 1540, which generate XOR bits that are then transferred to DRAM 106 (transfer 1990). Subsequently, fine programming may be scheduled, and a foggy read may be performed to read initial values from QLC storage 1412 to decoder 1524 (transfer 1780). XOR data is transferred from DRAM 106 to decoder 1542 (transfer 1992). Decoder 1542 then generates recovered values from the combination of foggy read data and XOR data (e.g., as illustrated in FIG. 13C). These recovered values are then used to perform fine programming of the memory cells that were previously foggy programmed (transfer 1784). Thus, in this example, in addition to the initial transfer 1774 (e.g., four logical pages) across bus 1424, there is also transfer of XOR data (e.g., one logical page for the four logical pages of data) from memory die 1532 to DRAM 106 and transfer of XOR data back from DRAM 106 to memory die 1532 on bus 1424.

While in some examples described, encoding and decoding for foggy-fine programming is performed on-chip (e.g., by encoding and decoding circuits formed on the same die as the memory structure in which data is programmed), in other examples, encoding and decoding circuits may be located in a control die that is bonded to a memory die in an integrated memory assembly. For example, XOR circuits and decoder circuits of FIGS. 15A, and 17-19 may be located in such a control die.

Figure 20:
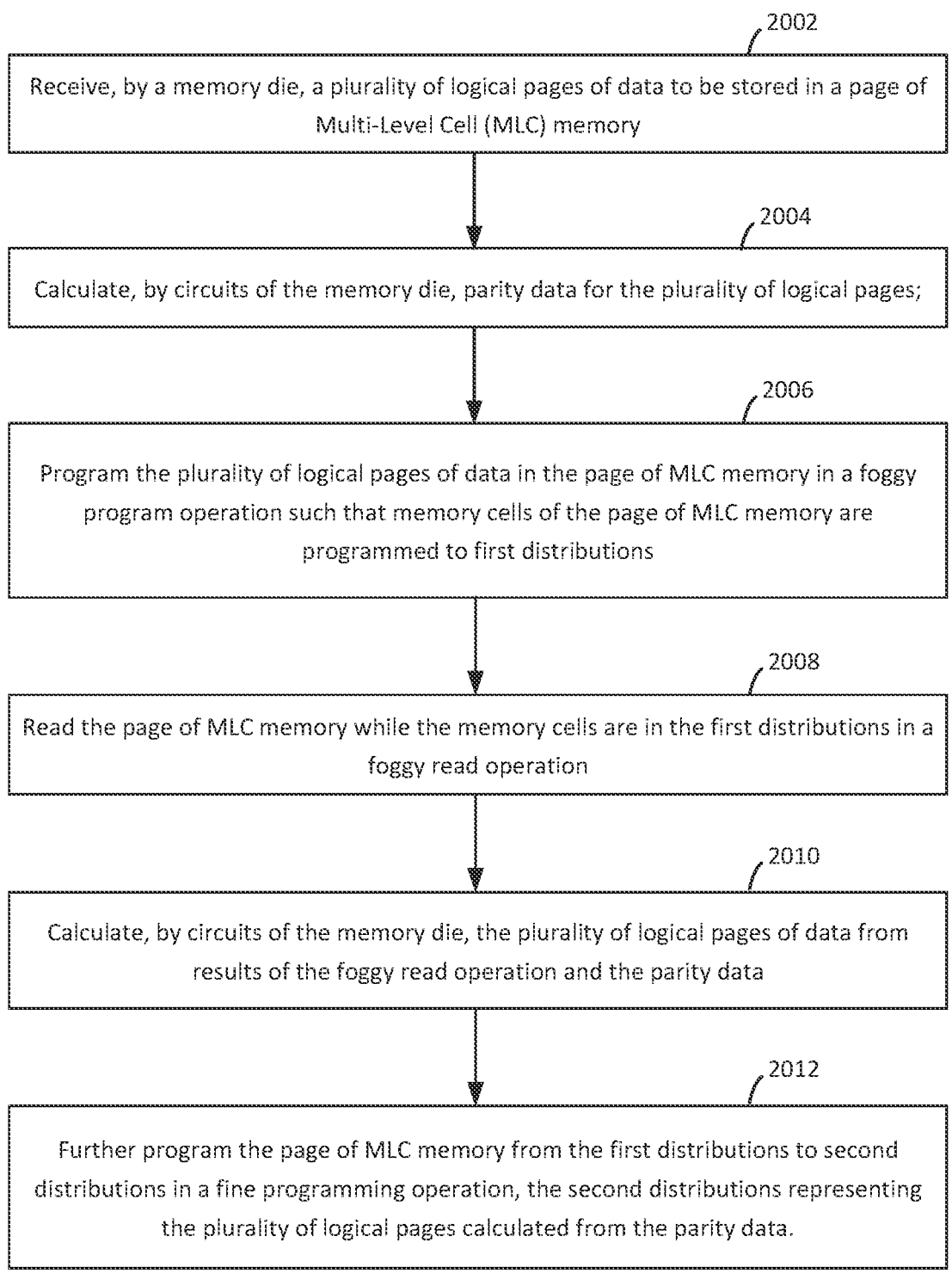
FIG. 20 illustrates an example of a method that includes programming data in a foggy program operation and further programming in a fine programming operation.

FIG. 20 is a flowchart illustrating an example of a method that implements aspects of the present technology. The method includes: receiving, by a memory die, a plurality of logical pages of data to be stored in a page of Multi-Level Cell (MLC) memory at step 2002; calculating, by circuits of the memory die, parity data for the plurality of logical pages at step 2004 (e.g., calculating a page of XOR bits for four logical pages of user data to be stored); and programming the plurality of logical pages of data in the page of MLC memory in a foggy program operation such that memory cells of the page of MLC memory are programmed to first distributions in step 2006. The method further includes: reading the page of MLC memory while the memory cells are in the first distributions in a foggy read operation of step 2008 (e.g., as illustrated in FIG. 13A); calculating, by circuits of the memory die, the plurality of logical pages of data from results of the foggy read operation and the parity data at step 2010 (e.g., calculating recovered values of FIG. 13C); and further programming the page of MLC memory from the first distributions to second distributions in a fine programming operation (e.g., as illustrated in FIG. 10), the second distributions representing the plurality of logical pages calculated from the parity data at step 2012. The method may include storing the parity data in the memory die in additional memory cells that are configured as Single Level Cell (SLC) cells and may further include reading the parity data from the SLC cells and performing Error Correction Code (ECC) decoding of the parity data prior to calculating the plurality of logical pages from the parity data, or may include sending the parity data from the memory die to be stored in a volatile memory and subsequently receiving the parity data from the volatile memory for the calculating (not illustrated in FIG. 20).

An example of a non-volatile storage apparatus, includes: a plurality of non-volatile memory cells formed on a memory die, each non-volatile memory cell configured to hold a plurality of bits of data; and a control circuit formed on the memory die, the control circuit configured to calculate parity data for data to be stored in the plurality of non-volatile memory cells, program the plurality of non-volatile memory cells to first distributions, read the plurality of non-volatile memory cells in the first distributions, recover the data from results of reading the non-volatile memory cells in the first distributions combined with the parity data, and further program the plurality of non-volatile memory cells from the first distributions to second distributions to store the data.

The control circuit may be further configured to program the parity data in additional non-volatile memory cells formed on the memory die, each additional non-volatile memory cell configured to hold one bit of data. The control circuit may be further configured to read the parity data from the additional non-volatile memory cells and send the parity data for Error Correction Code (ECC) decoding. The control circuit may be further configured to send the parity data for storage in volatile memory on a control die that is connected to the memory die and receive the parity data from volatile memory. The plurality of non-volatile memory cells may be located along a first word line of a NAND structure of the memory die, the control circuit further configured to program at least a second word line of the NAND structure between programming the plurality of non-volatile memory cells to the first distributions and further programming the plurality of non-volatile memory cells from the first distributions to the second distributions. The first distributions may consist of sixteen distributions representing four bits of data and the control circuit may be further configured to read the plurality of non-volatile memory cells in the first distributions using fourteen read voltages located at or near the middle of first distributions other than a lowest and a highest first distributions. The control circuit may be configured to program the plurality of non-volatile memory cells according to a Gray code such that neighboring distributions are assigned digital values that differ by one and only one bit. The control circuit may be configured to program the plurality of non-volatile memory cells to the first distributions in a foggy program operation such that first distributions have significant overlap and program the plurality of non-volatile memory cells from the first distributions to the second distributions in a fine programming such that the second distributions are narrower than the first distributions and have less overlap than the first distributions. The control circuit may be configured to calculate one logical page of parity data for four logical pages of data to be stored in the plurality of non-volatile memory cells, write the logical page of parity data in additional non-volatile memory cells formed on the memory die or send the logical page of parity data for storage outside the memory die, and subsequently read the logical page of parity data from the additional non-volatile memory cells or receive the logical page of parity data from outside the memory die for recovery of the data.

An example of a method includes: receiving, by a memory die, a plurality of logical pages of data to be stored in a page of Multi-Level Cell (MLC) memory; calculating, by circuits of the memory die, parity data for the plurality of logical pages; programming the plurality of logical pages of data in the page of MLC memory in a foggy program operation such that memory cells of the page of MLC memory are programmed to first distributions; reading the page of MLC memory while the memory cells are in the first distributions in a foggy read operation; calculating, by circuits of the memory die, the plurality of logical pages of data from results of the foggy read operation and the parity data; and further programming the page of MLC memory from the first distributions to second distributions in a fine programming operation, the second distributions representing the plurality of logical pages calculated from the parity data.

Calculating the parity data for the plurality of logical pages may include calculating one parity bit for each memory cell of the page of MLC memory. Calculating the parity data may include performing an Exclusive OR (XOR) operation on the plurality of logical pages. The method may include storing the parity data in the memory die in additional memory cells that are configured as Single Level Cell (SLC) cells. The method may further include reading the parity data from the SLC cells and performing Error Correction Code (ECC) decoding of the parity data prior to calculating the plurality of logical pages from the parity data. The method may further include sending the parity data from the memory die to be stored in a volatile memory and subsequently receiving the parity data from the volatile memory for the calculating. The method may further include, subsequent to the foggy programming operation and prior to the foggy read operation, programming at least one other page of the MLC memory. The page of MLC memory may be along a first word line of a NAND memory structure and the at least one other page of the MLC memory may be along at least a second word line of the NAND memory structure. Reading the page of MLC memory while the memory cells are in the first distributions may include using read levels at or near midpoints of the first distributions.

An example of a non-volatile storage apparatus includes a memory die including a plurality of non-volatile memory cells and further including: means for calculating parity data for data to be stored in the plurality of non-volatile memory cells; means for programming the plurality of non-volatile memory cells to first distributions; means for reading the plurality of non-volatile memory cells in the first distributions; and means for recovering the data from results of reading the plurality of non-volatile memory cells in the first distributions combined with the parity data and further programming the plurality of non-volatile memory cells from the first distributions to second distributions to store the data.

The non-volatile storage apparatus may include a memory controller die connected to the memory die, the memory controller die including means for Error Correction Code (ECC) decoding the parity data and sending decoded parity data to the means for recovering the data. For example, referring back to FIG. 2A, in the bonded die pair 394 the memory die can correspond to memory die 390 and the ECC can be performed on peripheral circuit or control die 398.

The encoded foggy-fine process described above combines the advantages of the foggy-fine programming mode with the advantage of being able to extract the data when in the foggy phase with little overhead or latency penalty as it can be implemented with simple logic on the memory die and does not need the controller's error correction engine. To operate most efficiently, the techniques described above assume that reading the foggy data from NAND occurs rapidly and with a very low bit error rate (BER). This assumption may not be true in extreme cases, such as an improper shutdown after foggy programming or extreme operating conditions for the memory device (such as an extreme cross temperature), where a higher BER can occur. As, being based on the parity values, the encoded foggy-fine can only correct one bit flip between adjacent grey codded states. The above discussion largely assumed that the encoded foggy-fine read thresholds are calibrated and does not look at methods to calibrate the 15 read threshold voltages of a 16-level QLC system. The next section discusses techniques to optimize the read thresholds tailored to the multi-level encoded foggy-fine programming method. Depending on the implementation, this foggy phase read threshold calibration can be performed on a period basis and/or in response to situations such as a high BER or change in operating conditions.

Techniques are known for optimizing multi-level read threshold voltages for flash and other non-volatile memory devices when programmed to relatively well-separated distributions, as in the fine phase. Such optimization of the read threshold becomes more crucial as more states are stored in a memory cell, such as for QLC products having 16 state cell voltage distributions with narrower distributions and higher risk of erroneous bits due to overlaps between the narrower states of the distributions of each state. A "standard" read threshold calibration algorithm, such as would be used with the data programmed into the fine state, is based on finding the cell voltage distribution minima (or BER minima) between two, adjacent states, such as for the read values shown in FIG. 9 for distinguishing between states (VrS7, for example, located at the minimum between the S6 and S7 distributions). In contrast, as shown in FIG. 13A the read levels used to extract the encoded foggy data are instead located at or near the center of a foggy distribution (RL7, for example, used for S7'). Consequently, new techniques need to be used to optimize the foggy phase read voltage levels.

The following discussion presents methods to calibrate read thresholds for the foggy programmed distributions when using an encoded foggy-fine programming scheme, where multiple embodiments are presented such that the tradeoff between complexity and gain can be optimized for the particular application. These schemes can be implemented either in the memory die, in the storage controller, in a bonded die pair, or a combination of these. Referring again to FIG. 13A, the main challenge in optimizing the set of $RL_1$-$RL_{15}$ thresholds is that they are located at the centers of the distribution states, while a "standard" read threshold calibration algorithm is designed to find the minima between 2 adjacent states.

In a first set of embodiments, the peaks of foggy stage distributions can be found to serve as the RL thresholds. The peaks of state distributions can be found by breaking the voltage axis into bins (i.e., ranges of read voltage levels) and counting the number of cells in each bin. In order to do this, each of the word lines is read in all the relevant voltages, the reads are performed, and the bin where each cell starts to conduct is the bin selected for this cell. Then, the bins' cells are summed. Depending on the embodiment, the determination can be based on a count of the number of cells of each bin to select the bin with the memory cells, or the bin values can be used to extrapolate an extremum for each distribution.

In a another set of embodiments, the valleys between state distributions can be found, and then the RL voltage levels can be chosen as the middle between these valleys. An example of this embodiment used is shown in FIG. 21, which repeats many of the features of FIG. 13A, but highlights the read values used to determine the example of $RL_1$.

Figure 21:
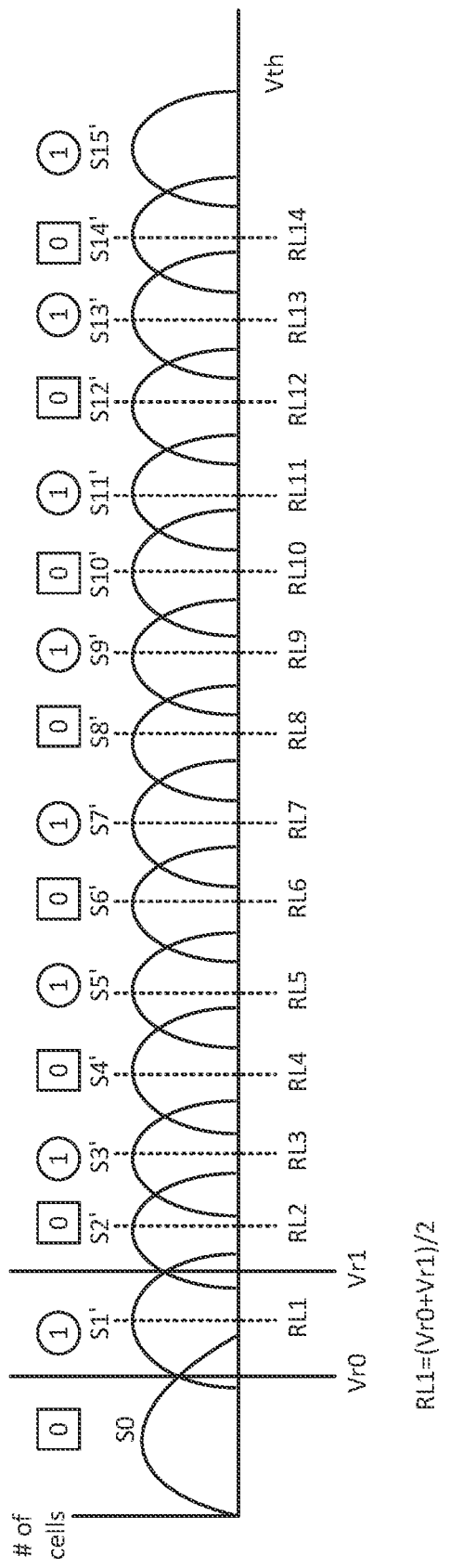
FIG. 21 illustrates the determination of a foggy read voltage level for a foggy distribution based on determining the valleys between the foggy state distributions.

More specifically, FIG. 21 illustrates the determination of a foggy read voltage level for a foggy distribution based on determining the valleys between the foggy state distributions. Similar to the more standard techniques for determining the optimal read points for the read voltage levels for (fine) programmed memory cell distributions, the valleys between each of the distributions can be determined. For example, looking at the S1', the valley between S0 and S1' can be determined to provide the VR0 value, and the valley between S1' and S2' can be determined to provide the VR1 value. The $RL_1$ value can then be taken as $RL_1$=(VR0+ VR1)/2. The accuracy of this embodiment can be reduced due to asymmetry in the distributions and also does not provide a determination of the $RL_{15}$ value.

In another set of embodiments, a scan can be performed for the RL levels by several reads with shifted read levels and using ECC related techniques to provide a best estimate for calibrating read thresholds to be used with the foggy phase data in the encoded foggy-fine scheme. The read thresholds found through this method are expected to perform better compared to the embodiments presented in the preceding several paragraphs, but use some additional computational overhead to perform. This technique reads an entire page of data from the memory and calculates ECC related information for the page of data using several different read threshold values. For example, a page can be read using three thresholds per logical page with five reads per threshold value, resulting in $5^3$ emulations stemming from the 5 regular reads. Based on these sensing operations and their ECC related information, a best estimate for the read values can be determined.

In some embodiments, the ECC related information can be used without fully decoding the ECC codewords read from the memory, such as by computing the number of unsatisfied ECC parity-check equations, also known as syndrome weights, without full decoding. This can reduce the latency associated with fully decoding each of the pages read as the syndrome weights can estimate number of errors without full decoding. In general, a read having a larger syndrome weight has more bit errors than a read having a smaller syndrome weight.

For example, in some embodiments the ECC engines 226/256 can generate syndrome values indicating a number of parity check equations that are unsatisfied for each set of read voltage levels used to read the page. The syndrome for each set of read voltage levels generally indicates a relative amount of errors in each of the corresponding set of read voltage levels. Depending on the embodiment, the syndrome can be generated using dedicated hardware circuitry with reduced latency as compared to full decoding, using software, using firmware, or some combination of these and be performed on the memory controller 102 and/or on the memory die 300 or control die 398. For example, referring to FIGS. 1E and 2A, the on-die control circuitry 310 can include a hardware syndrome weight (SW) computation block 215. The ECC related information may include syndrome values for each of the set of read voltage levels and the SW computation block 215 can search and/or sort the syndromes to identify a lowest estimated BER of set of read voltage levels and to select a best estimate set of read voltage levels. The SW computation block 215, or other circuitry used for this purpose, can determine the syndrome weight for each of the pages read using the read voltage levels and can select or estimate updated read voltages based on which of the sensing voltage levels results in a lowest syndrome weight.

As normally applied to a set of memory cells after programming (i.e., after the fine phase of a foggy-fine programming), the process is applied to determine the read voltage levels in the valleys between the memory cell threshold voltage distributions, such as VrA, VrB, . . . in FIG. 8 or VrS1, VrS2, . . . in FIG. 9. To estimate the best values for the read voltage levels, the logical data page is read multiple times, where the values are shifted slightly from read to read. For example, a set of 5 or 7 regular logical page reads can be performed, staring with read voltages on the lower side (to the left as represented in FIGS. 8 and 9) of the expected valleys between the distributions, and shifted with each read towards the higher side (right) for the sequence of reads. The more such reads, the better the estimate will be, but the more computation that will be needed. For each combination of read thresholds, the syndrome weight can then be computed. The shifted read threshold used to estimate the best set of read voltage levels can then be determined from these syndrome weights, such as by selecting the values that have the lowest syndrome or performing some processing to estimate an extrema (i.e., minimum for the expected BER).

The techniques just discussed, a "best estimate scan" or BES, use the syndrome weights to determine the best read voltage levels to distinguish between relatively well-defined distributions, such as occur after the fine phase program. The following looks at modifying the BES technique to operate with the data programmed in the foggy phase of the encoded foggy-fine process, where there is significant overlap of the memory cell threshold distributions, as is illustrated in FIG. 13A. Since each BES operation uses an entire logical page in the read, the foggy decode incorporates the even and odd XOR parity values into the operation.

In one set of BES based embodiments, the "standard" version is modified to use the foggy phase logical page after it was decoded using the parity bits (as described above with respect to FIG. 13D) as the BES input. Using these decoded foggy phase logical pages, the calibrated read thresholds represent an average between the even (0 parity values) and odd (1 parity values) distribution groups. After the calibration process is done for all the logical pages, aggregation can be conducted so that if there are states that were calibrated for several logical pages, their results may be averaged. This set of embodiments is illustrated with respect to FIG. 22.

Figure 22:
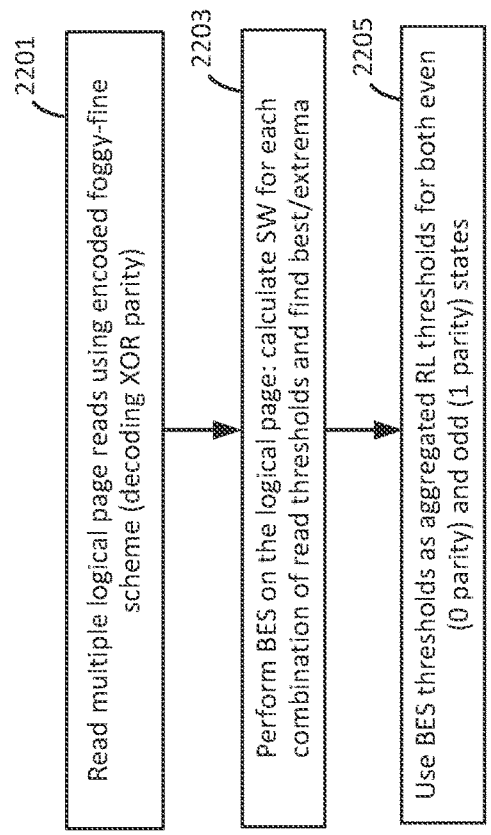
FIG. 22 is a flowchart for an embodiment for using the BES process for a set of memory cells programming in the foggy phase of an encoded foggy-fine programming process.

FIG. 22 is a flowchart for an embodiment using the BES process for a set of memory cells programmed into the foggy phase of an encoded foggy-fine programming process. At step 2201, a logical page of foggy programmed data is read several times, such as 5 or 7 times, and decoded using the XOR parity values as described with respect to FIGS. 13A-13D. Each of the several reads of the logical page is performed with the read voltage levels shifted relative to the other reads, and can be performed using the read circuitry elements on the memory of die 300 of FIG. 1E or control die 398 of FIG. 2A, including the elements of the on-die control circuitry 310, decoders/drivers 324/332, and read/write circuits 328.

In step 2203, the BES process is performed using the logical pages read and decoded in step 2201. Depending on the embodiment, this can be performed in syndrome weight computation block 315, on the controller 102, or a combination of these. Similarly to the process described above for a "standard" BES, the BES process of step 2203 calculates a syndrome weight for each combination of read voltage levels used in step 2201 and from these syndrome weights finds or interpolates the best estimate for these levels during subsequent operation. In step 2205, the BES determined threshold values are then aggregated as the read levels RL1-RL15 for both the even (0 parity) and odd (1 parity) states for subsequently performing the process as described with respect to FIGS. 13A-13E.

The method described with respect to FIG. 22 has an underlying assumption that the odd parity and even parity RLs of the same logical page move in the same direction. Although this assumption should usually hold, in some circumstances it may not be the case. In another set of BES based embodiments, the odd parity and even parity groups can be calibrated separately to avoid such assumptions.

In one implementation, the BES operation starts with default threshold locations for the read voltage levels, or values established in an earlier BES operation, and shifts the read voltage levels relative to these default values, read one logical page at a time. In a 4 bit per cell, or QLC, embodiment, four logical pages are stored in a physical page (e.g., a word line) and to read a given logical page, 3 or 4 read voltage levels are done at a time, such as corresponds to the bits T, C, B, and A of FIG. 13D. For example, the QLC four logical pages might be read with a 3, 4, 4, 4 read configuration. An initial good enough guess for the locations of RL1 to RL15 may be the average between the locations of the regular (i.e., fine state) VrS1 to VrS15 (see FIG. 9), such as shown on FIG. 23.

Figure 23:
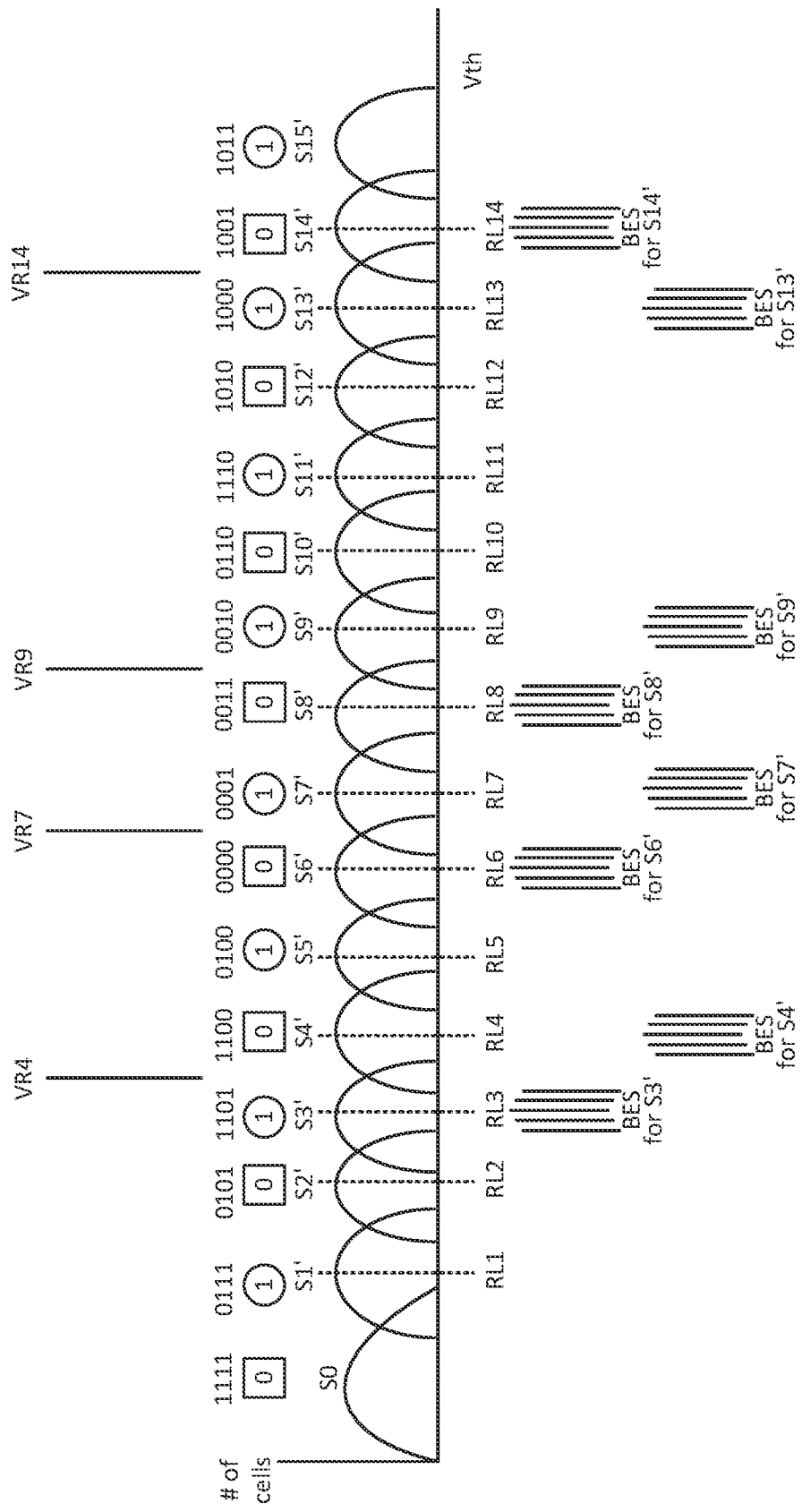
FIG. 23 repeats the elements of FIG. 13A, but with more detail added to illustrate an embodiment for estimating the foggy phase read levels.

FIG. 23 repeats the elements of FIG. 13A, but with more detail added to illustrate an embodiment for estimating the foggy phase read levels. As before, a 4-bit per cell embodiment is shown with the memory cell distributions programmed to the foggy states S0, S1', S2', . . . , S15', along with their corresponding parity values. Above the parity value for each of the distributions are now shown the 4-bit data value of each of the states in one example of a gray code for the states (e.g., S4'=1100). Above the distributions, the location of several of the read points similar to those used to distinguish between the data states where the memory cells programmed to the fine distributions of FIG. 9. The fine distribution read points shown would be used to distinguish between changes in the "A" (i.e., last) bit of the data values:

VrS4' (1101 to 1100), VrS7' (0000 to 0001), VrS9' (0011 to 0010), and VrS14' (1000 to 1001). Once fine programmed, these read points would be used to determine the bit corresponding to the data states where the A page values change. As before, the XOR parity page is calculated for all 4 QLC pages to get the parity bit 1 for the odd numbered distributions (S1' S3', . . . ) and 0 for the even numbered distributions (S0, S2' S4', . . . ).

Based on the ability to differentiate between even and odd memory cell voltage distributions using the parity values from the XOR-ed data, the memory system can perform the BES calculation by fixing one of the parity state distribution sets, for example the even state distributions, and optimizing first the odd only RL thresholds. In this implementation, the memory system will first optimize first RL1, RL3, RL5, RL7, RL9, RL11, RL13 and RL15, and, after these are optimized, the system can use them at their optimal points to calculate the odd states' RLs (RL0, RL2, RL4, RL6, RL8, RL10, RL12 and RL14). Alternately, the order could be reversed, with the odd states done first. For either order, the BES syndrome weight calculation's operation for each set can be same as done for the more usual BES operations for the fine programmed distributions; however, the system first needs to make sure that the XOR parity bits are correct according to the encoded foggy-fine method. After the XOR data is corrected, the can use it to optimize the RLs.

FIG. 23 also shows an embodiment for the read voltage levels of the BES process for the distributions to either side of the VrS4', VrS7', VrS9', and VrS14' when 5 sensing operations are used. These sets of voltage read levels ("BES 5") are schematically represented below the corresponding foggy distribution. The reads for the BES algorithm in this embodiment can be based on five sensing operations of a logical page with shifted thresholds $V_t-2\Delta$, $V_t-\Delta$, $V_t$, $V_t+\Delta$, $V_t+2\Delta$ (where all of the voltage levels are shifted by the same amount in this example), where $V_t$ can the default value or a previously determined RL value for the state and $\Delta$ is the voltage shift between the read levels (where the step size is uniform in this example). The five sensed pages can be transferred to the controller 102, syndrome weight computation block 315, or some combination of these that calculates the syndrome weights and accordingly makes a decision on the optimal location which minimizes the syndrome weight for the 3 or 4 thresholds.

For a single BES operation as just described, if #Senses is number of read operations for each distribution and #TH is the number distributions being read there are a total of (#Senses)^(#TH) potential combinations, totaling $5^4$ in this example, although in some embodiments the scanning mechanism can optimize the search such that it may be terminated early. However, for a naïve implementation of BES that calibrates the odd and even distributions' read voltage levels in the same operation, there are 8 thresholds per page, totaling in 5^8 combinations which is a high computational effort. Hence reducing the optimization space to an odd group and an even group and optimizing each group separately has an advantage that makes sense because the mixing of odd-odd or even-even bits are much lower and can be ignored in this step. Under this arrangement, each encoded foggy-fine BES operation incorporates two regular BES operations, one for the odd distributions and one for the even distributions. To calibrate all 15 RLs thresholds, there is no need to do encoded foggy-fine BES operations for all logical pages as 7/8 thresholds are calibrated per encoded foggy-fine BES operation. The mapping may be set such to allow this kind of separation. In the 4-3-4-4 mapping based on the encoding of FIG. 23, for example, only 5 BES operations are needed. In "regular" BES (such as for the fine programmed distributions), thresholds that comprise a logical page are calibrated separately from the other logical pages. In the enhanced foggy-fine BES for the foggy programmed distributions, it makes sense to calibrate all the thresholds of all logical pages within the same or adjacent BES operations as some read overhead is common between adjacent logical pages.

Figure 24:
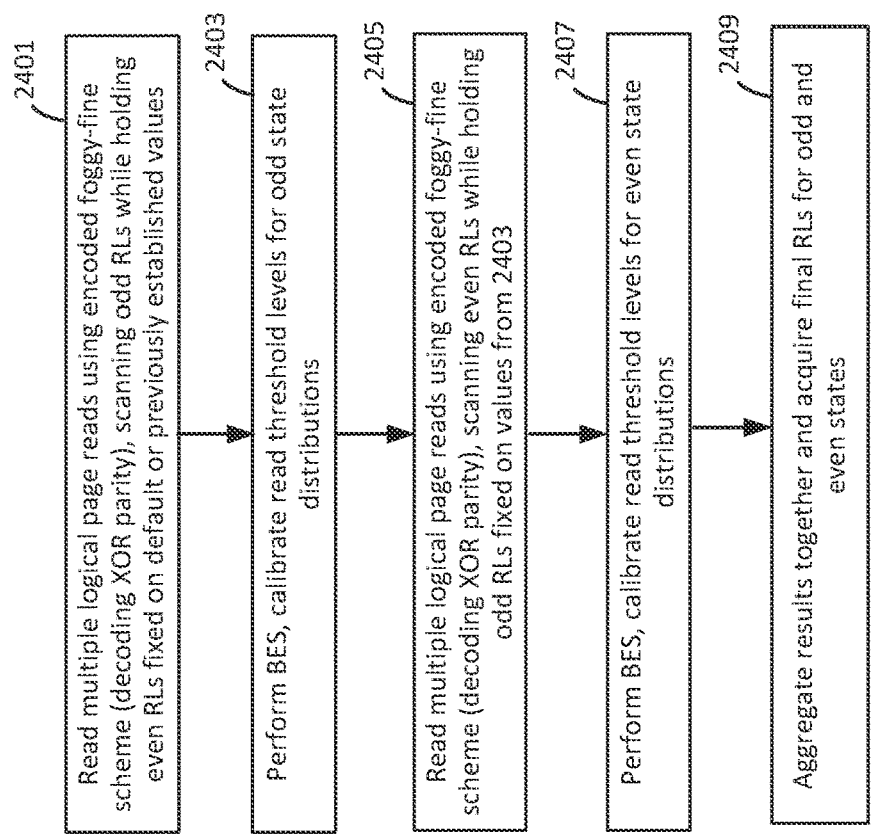
FIG. 24 is a flowchart for an embodiment of a best estimate scan operation for data programmed in the foggy phase of an encoded foggy-fine process in which one set of distributions (either odd or even) is calibrated before the other set.

FIG. 24 is a flowchart for an embodiment of a best estimate scan operation for data programmed in the foggy phase of an encoded foggy-fine process in which one set of distributions (either odd or even) is calibrated before the other set. Then, using the calibrated thresholds of one set, the other set will be calibrated. In the flow of FIG. 24, the odd parity states are calibrated first, after which the even states are calibrated, but other embodiments can reverse the order.

Starting at step 2401, while holding the even state read level values fixed, such as at default or previously established set of voltage levels, the odd state RL values are scanned. Similarly to step 2201, a logical page of foggy programmed data is read several times, such as 5 or 7 times, and decoded using the XOR parity values as described with respect to FIGS. 13A-13D. Each of several reads for the logical page is performed with the odd state read voltage levels shifted relative to the other reads, and can be performed using the read circuitry elements on the memory of die 300 of FIG. 1E or control die 398 of FIG. 2A, including the elements of the on-die control circuitry 310, decoders/drivers 324/332, and read/write circuits 328. At step 2403 the BES process is performed using the logical pages read and decoded in step 2401 to calibrate the RL levels for the odd state distributions. Depending on the embodiment, this can be performed in syndrome weight computation block 315, on the controller 102, or a combination of these. Similarly to the process described above for a "standard" BES, the BES process of step 2403 calculates a syndrome weight for each combination of read voltage levels used in step 2401 and from these syndrome weights finds or extrapolates the best estimate for these levels during subsequent operation.

Steps 2405 and 2407 respectively repeat steps 2401 and 2403, but for the even state distributions while holding the odd state RL values fixed at the voltage levels as determined in step 2403. Once the even state RL values are determined in step 2407, at step 2409 they are aggregated with the results of step 2403 for the odd state distributions to generate the final set of RL values for all of the foggy state memory cell voltage distributions. A number of variations of FIG. 24 are possible. For example, in some embodiments, by using additional memory to store all of the logical pages and calculating the odd and even RL values simultaneously latency can be reduced. In this case, after the calibration process, aggregation may be conducted so that if there are states that were calibrated in both instances their results may be averaged.

FIG. 25 is a flowchart for an embodiment of encoded foggy-fine operation that incorporates the calibration of the read voltage levels for reading of the foggy distributions. More specifically, FIG. 25 incorporates the calibration of the RL levels into the flow of FIG. 20 discussed above. Consequently, steps 2501, 2503, and 2505 can respectively correspond to steps 2002, 2004, and 2006 of: receiving logical pages of data to be stored in a page of Multi-Level Cell (MLC) memory; calculating parity data for the plurality of logical pages; and programming the plurality of logical pages of data in a foggy program operation such that memory cells of the page of memory are programmed to first distributions. These steps are described in more detail above with respect to FIG. 20.

A decision to determine whether to calibrate the foggy state read voltage levels (RL values) follows at step 2507 as, in most embodiments, such a calibration would not be performed prior to most of the subsequent read at step 2515. It should be noted that step 2507 need not follow immediately after the programming of step 2505, but could occur at any subsequent time prior to reading out the foggy phase data in step 2515. The decision on whether to perform a calibration (or recalibration) can be based on one or more criteria, depending on the embodiment, such as on the amount of time since a previous calibration, factors such as a high bit error rate when recovering the data from the foggy state distributions, a high program-erase count, or operating conditions, for example. If a calibration is not to be performed prior reading out the foggy data ("NO" path from step 2507), the current RL values are maintained (step 2509) and the flow continues on to step 2515. The current RL values at step 2509 can be default values or values previously calibrated in a previous pass through the flow.

If a calibration is to be performed ("YES" path from step 2507), this follows at steps 2511, by performing a set of reads of the foggy distributions, and 2513, where the RL values are established based on the reads of step 2511. The specifics of these steps can be according to one of the several embodiments presented above. For example, in a first set of embodiments, the peaks of foggy stage distributions can be found to serve as the RL thresholds by breaking the voltage axis into bins (i.e., range of read voltage levels) and counting the number of cells in each bin. In a another set of embodiments, the valleys between state distributions can be found, and then the RL voltage levels can be chosen as the middle between these valleys, as described above with respect to FIG. 21. Still other embodiments can be based on the BES processes as described above with respect to FIG. 22 and with respect to FIGS. 23 and 24. Once the RL values are calibrated in step 2513, the foggy data can be read with these values in step 2515b. Although step 2517 is shown to directly follow step 2515, it will be understood there can a variable amount of time elapsed before this occurs.

Once a recovery of the data from the foggy distributions is to be performed (following from either of step 2509 or step 2513), the flow continues on to steps 2515, 2517, and 2519, which can respectively correspond to steps 2008, 2010, and 2012 of FIG. 20 and are described in more detail above. Depending on the decision at step 2507, the read of step 2515 will either use the retained RL values of step 2009 or the values as calibrated in step 2513, with the read values and parity data used to recover the data at 2517, which, if desired, can then be fine programmed.

Consequently, for any of the above embodiments, techniques are introduced to enable the calibration of the read voltage level used to extract the data content of the foggy phase cell voltage distributions in the encoded foggy-fine scheme. The availability of a reliable method for read threshold calibration in the encoded foggy-fine process can noticeably reduce the bit error rate induced by the memory after the foggy state was written and before the fine state is written.

According to a first set of aspects, an apparatus includes a control circuit configured to connect to one or more arrays of a plurality of non-volatile memory cells each configured to hold a plurality of bits of data. The control circuit is configured to: calculate parity data for data to be stored in the plurality of non-volatile memory cells; program the plurality of non-volatile memory cells to a plurality of first distributions; perform a plurality of first reads of the plurality of the non-volatile memory cells in the first distributions; determine from results of the first reads a plurality read voltage levels for a plurality of second reads of the plurality of the non-volatile memory cells in the first distributions; perform the plurality of second reads of the plurality of non-volatile memory cells in the first distributions using the determined read voltages; and recover the data to be stored in the plurality of non-volatile memory cells from a combination of the second reads and the parity data.

In additional aspects, a method includes: receiving, by a memory device, a plurality of logical pages of data to be stored in a page of a Multi-Level Cell (MLC) memory having a plurality of non-volatile memory cells; calculating, by circuits of the memory device, parity data for the plurality of logical pages; and programming the plurality of logical pages of data in the page of MLC memory in a foggy program operation such that the memory cells of the page of MLC memory are programmed to a plurality of first distributions. The method further includes: reading the page of MLC memory while the memory cells are in the first distributions in a plurality of first foggy read operations; determining, by circuits of the memory device, from results of the first foggy read operations read voltage levels for a plurality of second reads of the plurality of the non-volatile memory cells in the first distributions; reading the page of MLC memory while the memory cells are in the first distributions in the plurality of second foggy read operations using the determined read voltage levels; and recovering, by circuits of the memory die, the plurality of logical pages of data from results of the second foggy read operations and the parity data.

In another set of aspects, a non-volatile memory device includes a plurality of non-volatile memory cells each configured to hold a plurality of bits of data and one or more control circuits connected to the plurality of non-volatile memory cells. The one or more control circuits can comprise: means for calculating parity values for data to be stored in the plurality of non-volatile memory cells; means for programming the data to be stored in the plurality of non-volatile memory cells to first distributions in a foggy program operation such that the first distributions have significant overlap; means for optimizing voltage values for reading the plurality of non-volatile memory cells programmed to the first distributions; means for reading the plurality of non-volatile memory cells in the first distributions using the optimized voltage values; means for recovering the data to be stored in the plurality of non-volatile memory cells from results of reading the plurality of non-volatile memory cells in the first distributions combined with the parity values; and means for further programming the plurality of non-volatile memory cells from the first distributions to second distributions to store the recovered data.

In one set of embodiments the means for calculating parity values for data to be stored in the plurality of non-volatile memory cells can include the on-die control circuitry 310 of FIG. 1E or 2A, elements of the memory controller 102 (such as ECC block 226/256, XORblock224/ 254, and other memory controller elements), or a combination of these.

In one set of embodiments the means for programming data to be stored in the plurality of non-volatile memory cells to first distributions in a foggy program can include read/write circuitry 328, row decoder 324, column decoder 332, and control circuitry 310 including state machine 312, on-chip address decoder 314, and power control circuit 316 of FIGS. 1E and 2A. The operation of these elements for performing a foggy programming operation can be as described above with respect to FIGS. 7-11.

In one set of embodiments the means for optimizing voltage values for reading the plurality of non-volatile memory cells programmed to the first distributions can correspond to the elements sued to perform steps 2511 and 2512 of FIG. 25. This can include circuitry for reading the foggy programmed data, such read/write circuitry 328 with sense blocks 350, row decoder 324, column decoder 332, control circuitry 310 including state machine 312, on-chip address decoder 314, and power control circuit 316 of FIGS. 1E and 2A. From the read values, the optimized voltage can be determined by the on-die control circuitry 310 (including SW computation block 315) of FIG. 1E or 2A, elements of the memory controller 102 (such as ECC block 226/256, XOR block 224/254, and other memory controller elements), or a combination of these In one set of embodiments the means for reading the plurality of non-volatile memory cells in the first distributions using the optimized voltage values can include read/write circuitry 328 with sense blocks 350, row decoder 324, column decoder 332, control circuitry 310 including state machine 312, on-chip address decoder 314, and power control circuit 316 of FIGS. 1E and 2A, where further detail, including latch structures, given in FIGS. 3A, 3B, and 4. This can correspond to step 2515 of FIG. 25.

In one set of embodiments the means for recovering the data to be stored in the plurality of non-volatile memory cells from results of reading the plurality of non-volatile memory cells in the first distributions combined with the parity values can include logic circuitry in the on-die control circuitry 310 that can combine the read results with the parity as in step 2517 of FIG. 25 and FIGS. 13A-13E.

In one set of embodiments the means for further programming the plurality of non-volatile memory cells from the first distributions to second distributions to store the recovered data can again include can include read/write circuitry 328, row decoder 324, column decoder 332, and control circuitry 310 including state machine 312, on-chip address decoder 314, and power control circuit 316 of FIGS. 1E and 2A. The operation of these elements for performing a fine programming operation can be as described above with respect to FIGS. 7-11 and step 2519 of FIG. 25.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

We claim:

1. An apparatus, comprising:
a control circuit configured to connect to one or more arrays of a plurality of non-volatile memory cells, each of the memory cells configured to hold a plurality of bits of data, the control circuit configured to:
calculate parity data for data to be stored in the plurality of non-volatile memory cells;
program the plurality of non-volatile memory cells to a plurality of first distributions;
perform a plurality of first reads of the plurality of the non-volatile memory cells in the first distributions;
determine from results of the first reads a plurality of read voltage levels for a plurality of second reads of the plurality of the non-volatile memory cells in the first distributions;
perform the plurality of second reads of the plurality of non-volatile memory cells in the first distributions using the determined read voltages; and
recover the data to be stored in the plurality of non-volatile memory cells from a combination of the second reads and the parity data.

2. The apparatus of claim 1, wherein the control circuit is further configured to:
further program the plurality of non-volatile memory cells from the first distributions to second distributions to store the recovered data.

3. The apparatus of claim 2, wherein the control circuit is further configured to program the plurality of non-volatile memory cells to the first distributions in a foggy program operation such that the first distributions overlap, and program the plurality of non-volatile memory cells from the first distributions to the second distributions in a fine programming such that the second distributions are narrower than the first distributions and have less overlap than the first distributions.

4. The apparatus of claim 1, wherein the control circuit is formed on a control die, the apparatus further comprising:
a memory die including the one or more arrays of non-volatile memory cells, the memory die formed separately from and bonded to the control die.

5. The apparatus of claim 1, wherein the control circuit is formed on a single die with the one or more arrays of non-volatile memory cells.

6. The apparatus of claim 1, wherein, to determine the plurality read voltage levels for the plurality of second reads from the results of the first reads, the control circuit is configured to:
perform the first reads to determine a number of memory cells belonging to each of a plurality of threshold voltage range bins for one or more of the first distributions;

count a number of memory cells belonging to the bins for each of the one or more first distributions; and determine one or more of the read voltage levels for a plurality of second reads from the counted numbers.

7. The apparatus of claim 1, wherein the control circuit is further configured to:

further program the plurality of non-volatile memory cells from the first distributions to second distributions to store the recovered data, and wherein one or more of the plurality read voltage levels for the plurality of second reads are determined as values intermediate to read voltage levels used to read memory cells programmed to the second distributions.

8. The apparatus of claim 1, wherein, to determine the plurality of read voltage levels for the plurality of second reads from the results of the first reads, the control circuit is configured to:

apply error correction code related techniques to determine the read voltage levels for the plurality of second reads based on an amount of error of the results of the first reads.

9. The apparatus of claim 8, wherein applying error correction code related techniques to determine the read voltage levels for the plurality of second reads comprises computing syndrome weights for the results of the first reads.

10. The apparatus of claim 9, wherein the plurality of first distributions include a subset of distributions having odd parity data and a subset having even parity data and, in computing the syndrome weights for the results of the first reads, syndrome weights for the subsets are computed for results of the first reads for each of the subsets while holding read voltage levels for the first read values of the other of the subsets fixed.

11. The apparatus of claim 9, wherein the plurality of first distributions is a subset of distributions having odd parity data and a subset having even parity data and, in computing the syndrome weights for the results of the first reads, syndrome weights for both subsets are computed concurrently.

12. The apparatus of claim 9, wherein the apparatus further comprises a memory controller connected to the control circuit and, to apply error correction code related techniques to determine the read voltage levels for the plurality of second reads, the control circuit is configured to:

transfer the results of the first reads to the memory controller; and subsequently receive the syndrome weights for the results of the first reads from the memory controller.

13. The apparatus of claim 9, wherein the control circuit includes one or more control circuits configured to compute the syndrome weights for the results of the first reads.

14. A method, comprising:

receiving, by a memory device, a plurality of logical pages of data to be stored in a page of a Multi-Level Cell (MLC) memory having a plurality of non-volatile memory cells;

calculating, by circuits of the memory device, parity data for the plurality of logical pages of data;

programming the plurality of logical pages of data in the page of MLC memory in a foggy program operation such that the memory cells of the page of MLC memory are programmed to a plurality of first distributions;

reading the page of MLC memory while the memory cells are in the first distributions in a plurality of first foggy read operations;

determining, by circuits of the memory device, from results of the first foggy read operations, read voltage levels for a plurality of second reads of the plurality of the non-volatile memory cells in the first distributions;

reading the page of MLC memory while the memory cells are in the first distributions in the plurality of second foggy read operations using the determined read voltage levels; and recovering, by circuits of the memory die, the plurality of logical pages of data from results of the second foggy read operations and the parity data.

15. The method of claim 14, further comprising:

further programming the page of MLC memory from the first distributions to second distributions in a fine programming operation, the second distributions representing the recovered plurality of logical pages.

16. The method of claim 15, wherein determining from results of the first foggy read operations read voltage levels for the plurality of second reads comprises:

determining the read voltage levels for the plurality of second reads as values intermediate to read voltage levels used to read memory cells programmed to the second distributions.

17. The method of claim 14, wherein determining from results of the first foggy read operations read voltage levels for the plurality of second reads comprises:

performing the first read operations to determine a number of memory cells belonging to each of a plurality of threshold voltage range bins for one or more of the first distributions;

count a number of memory cells belonging to the bins for each of the one or more first distributions; and determine one or more of the read voltage levels for a plurality of second reads from the counted numbers.

18. The method of claim 14, wherein determining from results of the first foggy read operations read voltage levels for the plurality of second reads comprises:

computing syndrome weights for the results of the first foggy read operations; and determining the read voltage levels for the plurality of second reads from the computed syndrome weights.

19. The method of claim 18, wherein the plurality of first distributions include a subset of distributions having odd parity data and a subset having even parity data and computing syndrome weights for the results of the first foggy read operations comprises computing for results of the first reads for each of the subsets while holding read voltage levels for the first read values of the other of the subsets fixed.

20. A non-volatile memory device, comprising:

a plurality of non-volatile memory cells each configured to hold a plurality of bits of data; and one or more control circuits connected to the plurality of non-volatile memory cells, the one or more control circuits comprising:

means for calculating parity values for data to be stored in the plurality of non-volatile memory cells;

means for programming the data to be stored in the plurality of non-volatile memory cells to first distributions in a foggy program operation such that the first distributions have significant overlap;

means for optimizing voltage values for reading the plurality of non-volatile memory cells programmed to the first distributions;

means for reading the plurality of non-volatile memory cells in the first distributions using the optimized voltage values;

means for recovering the data to be stored in the plurality of non-volatile memory cells from results of reading the plurality of non-volatile memory cells in the first distributions combined with the parity values; and means for further programing the plurality of non-volatile memory cells from the first distributions to second distributions to store the recovered data.

* * * * *